(12) United States Patent
Matsumoto

(10) Patent No.: US 7,848,112 B2
(45) Date of Patent: Dec. 7, 2010

(54) SEMICONDUCTOR DEVICE

(75) Inventor: Manabu Matsumoto, Chiyoda-ku (JP)

(73) Assignee: Mitsubishi Electric Corporation, Tokyo (JP)

(*) Notice: Subject to any disclaimer, the term of this patent is extended or adjusted under 35 U.S.C. 154(b) by 829 days.

(21) Appl. No.: 11/752,618

(22) Filed: May 23, 2007

(65) Prior Publication Data
US 2008/0142948 A1 Jun. 19, 2008

(30) Foreign Application Priority Data
Dec. 15, 2006 (JP) .............................. 2006-338604

(51) Int. Cl.
*H05K 5/00* (2006.01)
(52) U.S. Cl. .................. 361/730; 361/800; 439/266
(58) Field of Classification Search .................. 361/760, 361/730, 752, 800, 797, 790, 726; 439/266
See application file for complete search history.

(56) References Cited

U.S. PATENT DOCUMENTS 7,445,519 B2 * 11/2008 Matsumoto .................. 439/709

2006/0126312 A1 6/2006 Kroneder

FOREIGN PATENT DOCUMENTS

| CN | 2267541 Y | 11/1997 |
|---|---|---|
| DE | 102 58 570 A1 | 7/2004 |
| JP | 62-73750 | 4/1987 |
| JP | 5-160339 | 6/1993 |
| JP | 8-7956 | 1/1996 |
| JP | 9-232479 | 9/1997 |
| JP | 10-116961 | 5/1998 |

* cited by examiner

*Primary Examiner*—Hung S Bui
(74) *Attorney, Agent, or Firm*—Oblon, Spivak, McClelland, Maier & Neustadt, L.L.P.

(57) ABSTRACT

On a case member of a semiconductor device, a screw block terminal or the like for connection to external equipment is attached. The screw block terminal or the like arranged on a region inside a base plate is attached to a terminal attachment member. Terminal attachment member has wall-like bodies, similar to wall-like bodies formed on a sidewall portion, formed along the direction of extension of terminal attachment member. On one end of terminal attachment member in the direction of extension, a side fitting portion is formed that corresponds to the wall-like body, and by fitting the side fitting portion to a space between sidewall portion and the wall-like body, terminal attachment member is fixed on case member. Thus, a semiconductor device is provided that allows high degree of freedom with simpler structure, as to the position of attaching a screw block terminal or a pin terminal to the case member.

9 Claims, 26 Drawing Sheets

SEMICONDUCTOR DEVICE

BACKGROUND OF THE INVENTION

1. Field of the Invention

The present invention relates to a semiconductor device and, more specifically, to a semiconductor device having a power semiconductor contained in a package.

2. Description of the Background Art

Semiconductor devices used for driving inverters of industrial equipment have various and many forms corresponding to the numbers of packages or switching elements such as an IGBT (Insulated Gate Bipolar Transistor), and the forms are denoted, for example, as 1in1, 2in1 or 7in1. Specifically, 1in1 denotes a semiconductor device having one switching element mounted on one package, and 2in1 denotes one having two switching elements mounted on one package, while 7in1 denotes a semiconductor device having a total of 7 switching elements, that is, 6 switching elements for a 3-phase inverter and one switching element for braking, mounted on one package.

Further, screw block terminals and pin terminals are attached to a semiconductor device, for connection to an external device or the like. A semiconductor device has such a structure that easily allows change in attachment position of such a screw block terminal or pin terminal, in accordance with its form. Specifically, on a case member forming the package of a semiconductor device, wall-like terminal fixing members extending from a sidewall portion are formed at a prescribed interval from each other, to provide a plurality of fixing positions along the periphery. A screw block terminal or a pin terminal is fixed by the terminal fixing member at a prescribed position corresponding to its form. References disclosing general semiconductor devices having connection terminals for external connection include Japanese Patent Laying-Open Nos. 10-116961, 08-007956, 62-073750 and 05-160339.

As described above, a conventional semiconductor device has wall-like fixing portions formed along the outer periphery of the case member, and hence, it follows that screw block terminals and pin terminals are attached on the outer periphery of the case member.

SUMMARY OF THE INVENTION

The present invention proposes an improvement for such a semiconductor device, and its object is to provide a semiconductor device having higher degree of freedom as to the position of attachment of a screw block terminal or a pin terminal on the case member, with a simpler structure.

The present invention provides a semiconductor device, including a case member, a plurality of terminals, first terminal fixing portions and a terminal attachment member. The case member has a base plate and a sidewall portion formed along the outer edge of the base plate, and houses a semiconductor mounting board. The plurality of terminals are each electrically connected to the semiconductor mounting board. The first terminal fixing portions are formed inside and along the sidewall portion with a prescribed interval, for fixing any of the plurality of terminals by fitting the terminal thereto. The terminal attachment member has, at least on one end side, a one-end-side fitting portion that fits the first terminal fixing portion, attached to extend from the outer edge of the base plate to the inner region, and has second terminal fixing portions formed with a prescribed interval, along the direction of extension, for fixing another one of the plurality of terminals by fitting the said another one of the terminals.

According to another aspect, the present invention provides a semiconductor device including a case member, a plurality of terminals, first terminal fixing portions and a terminal attachment member. The case member has a base plate and a sidewall portion formed along the outer edge of the base plate, and houses a semiconductor mounting board. The plurality of terminals are each electrically connected to the semiconductor mounting board. The first terminal fixing portions are formed inside and along the sidewall portion with a prescribed interval, for fixing any of the plurality of terminals by fitting the terminal thereto. The terminal attachment member is arranged on the base member, and has second terminal fixing portions formed with a prescribed interval, for fixing another one of the plurality of terminals by fitting the said another one of the terminals.

According to a still another aspect, the present invention provides a semiconductor device including a case member, a plurality of terminals, terminal fixing portions and a catching portion. The case member has a base plate and a sidewall portion formed along the outer edge of the base plate, and houses a semiconductor mounting board. The plurality of terminals are each electrically connected to the semiconductor mounting board. The terminal fixing portions are formed inside and along the sidewall portion with a prescribed interval, for fixing any of the plurality of terminals by fitting the terminal thereto. The catching portion is provided protruded on an insulating substrate of the semiconductor mounting board, for fixing another one of the plurality of terminals inserted and caught thereby.

In the semiconductor device according to the present invention, the position for attaching a terminal is not limited to the outer peripheral portion along the sidewall portion where the first terminal fixing portions are formed, and a terminal can be attached to the inner region of the base plate using the second terminal fixing portion of the terminal attachment member. Further, the terminal attachment member as such can be attached to the case member simply by fitting the one-end-side fitting portion into the first terminal fixing portion. As a result, the degree of freedom of the position for attaching the terminal can be increased with a simple structure.

In the semiconductor device according to another aspect of the present invention, the position for attaching a terminal is not limited to the outer peripheral portion along the sidewall portion where the first terminal fixing portions are formed, and a terminal can be attached to the inner region of the base plate using the second terminal fixing portion of the terminal attachment member arranged on the base plate. As a result, the degree of freedom of the position for attaching the terminal can be increased with a simple structure.

In the semiconductor device according to still another aspect of the present invention, the position for attaching a terminal is not limited to the outer peripheral portion along the sidewall portion where the first terminal fixing portions are formed, and a terminal can be attached to the inner region of the base plate using the catching portion provided protruded on the insulating substrate of the semiconductor mounting board. As a result, the degree of freedom of the position for attaching the terminal can be increased with a simple structure.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

Figure 1:
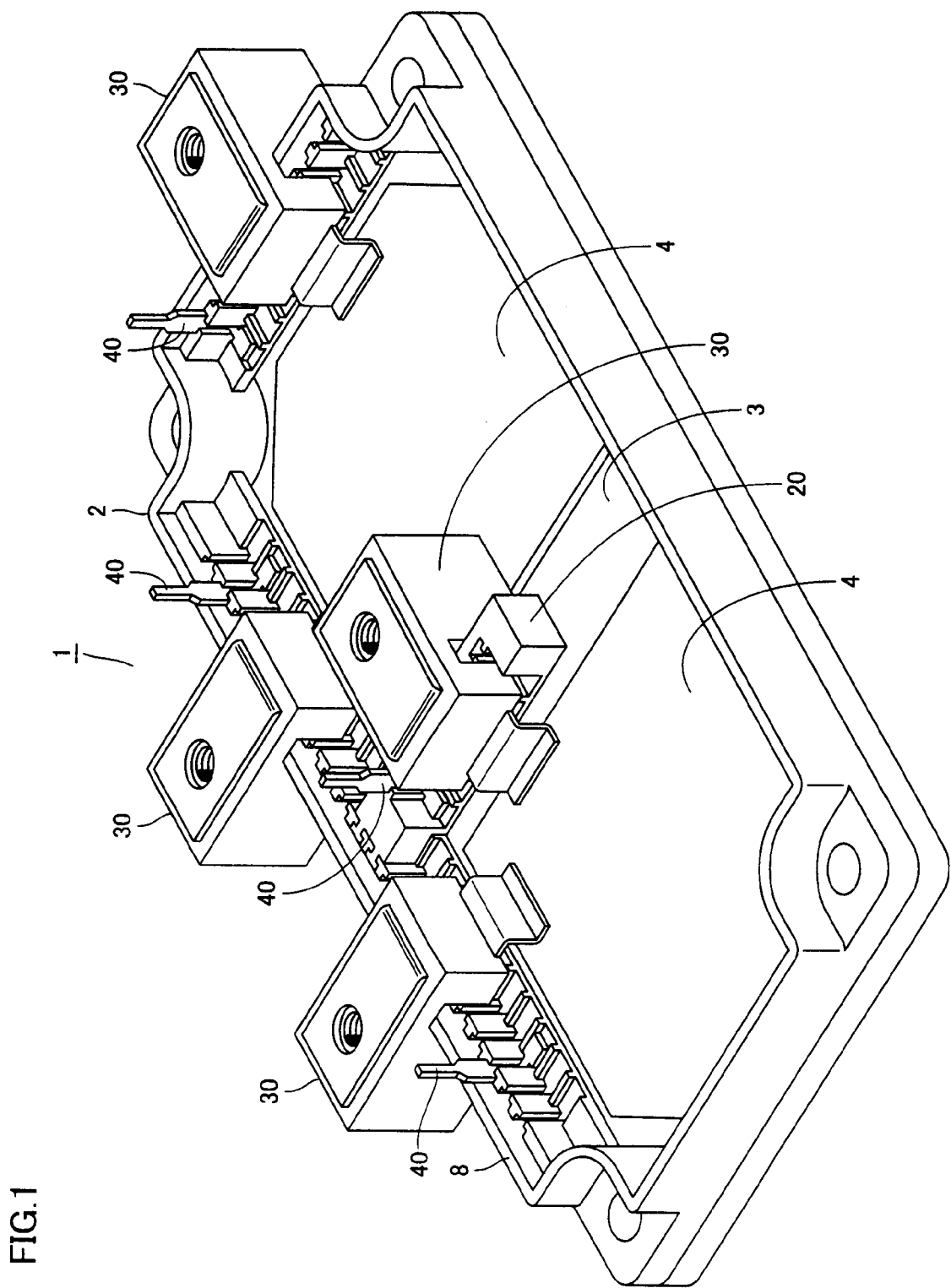
FIG. 1 is a perspective view of a semiconductor device in accordance with Embodiment 1 of the present invention.
Figure 2:
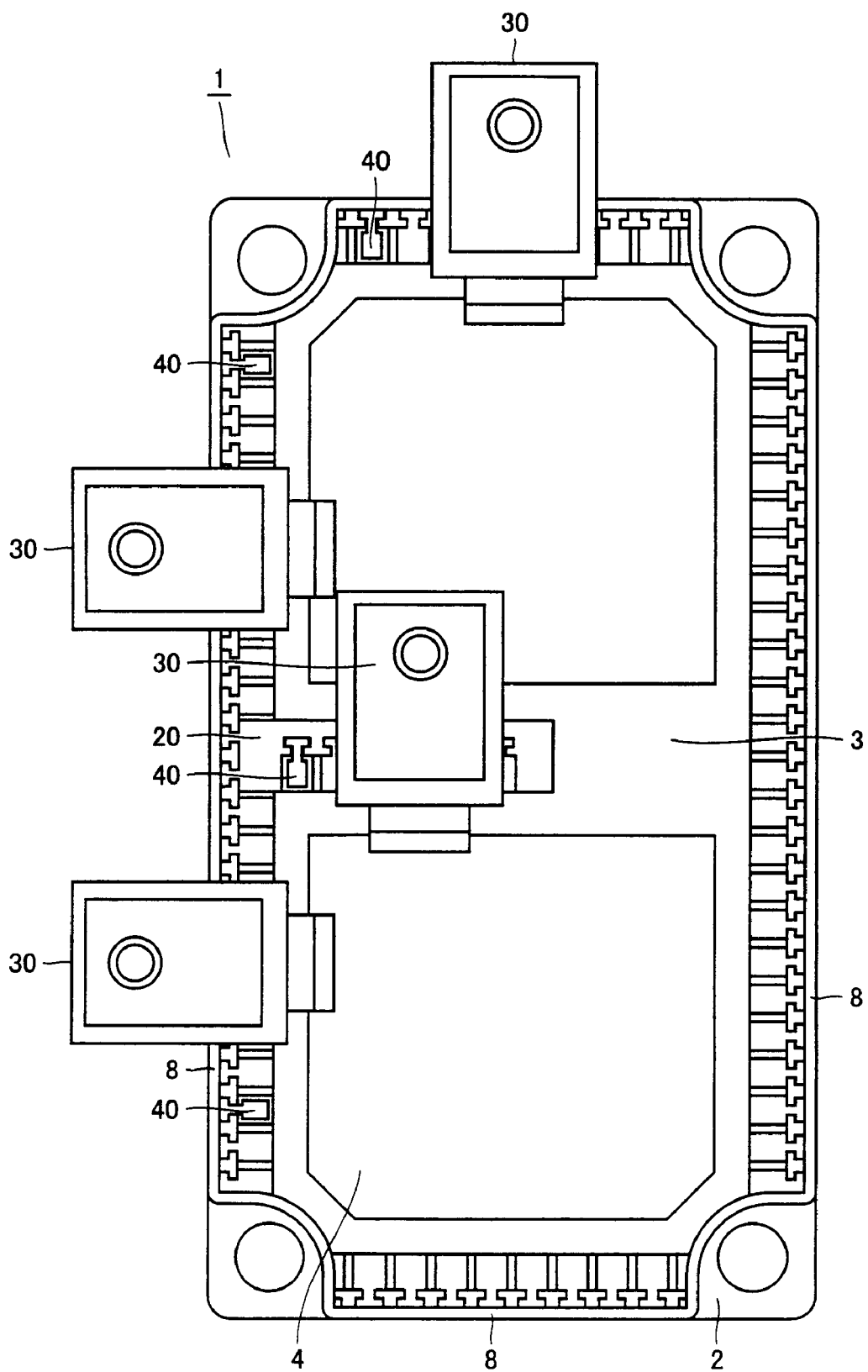
FIG. 2 is a top view of the semiconductor device in accordance with the embodiment.

A semiconductor device in accordance with Embodiment 1 of the present invention will be described. Referring to FIGS. 1 and 2, in a semiconductor device 1, a semiconductor mounting board 4 is housed in a case member 2 with a bottom, as a package. On the bottom of case member 2, a base plate 3 is arranged, and semiconductor mounting board 4 is placed on base plate 3. Further, on case member 2, a screw block terminal 30 and a pin terminal 40 are attached as terminals for connecting semiconductor device 1 to external equipment (not shown). Screw block terminal 30 and pin terminal 40 are attached respectively at a prescribed position on the outer periphery of base plate 3 and a prescribed position in the inner region of base plate 3. Semiconductor device 1 particularly has a terminal attachment member 20 allowing attachment of screw block terminal 30 and pin terminal 40 to the inner region of base plate 3.

Figure 3:
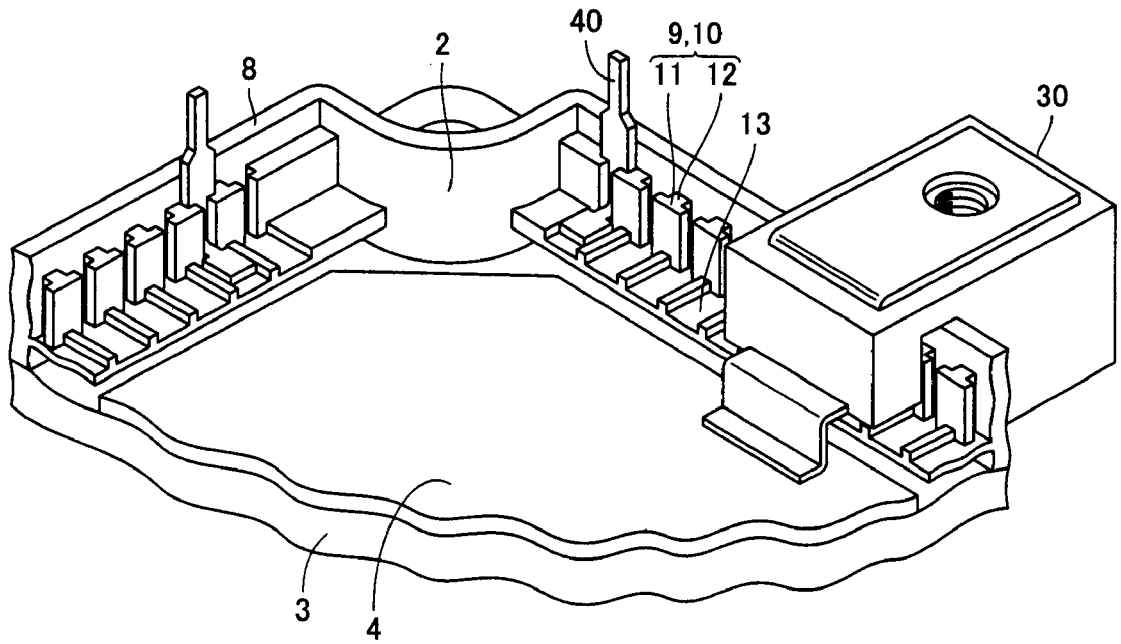
FIG. 3 is a partially enlarged perspective view of the semiconductor device in accordance with the embodiment.
Figure 4:
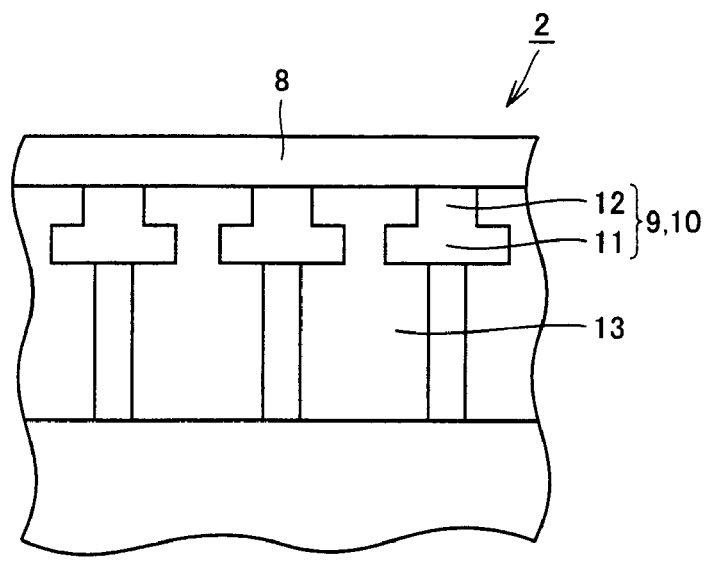
FIG. 4 is a partially enlarged plan view of the semiconductor device in accordance with the embodiment.

The structure of semiconductor device 1 will be described in greater detail. As can be seen from FIG. 1, a sidewall portion 8 of a prescribe height is formed along the outer edge of the outer periphery of base plate 3. On the inside of sidewall portion 8, terminal fixing portion 9 (see FIG. 3) is arranged for fixing screw block terminal 30 and pin terminal 40 on case member 2. As shown in FIGS. 3 and 4, terminal fixing portion 9 includes a plurality of wall-like bodies 10 extending inward from the sidewall portion 8, and each wall-like body 10 consists of a wall body 11 apart by a distance from sidewall portion 8 and a connecting body 12 connecting the wall body 11 and the sidewall portion 8. The plurality of wall-like bodies 10 are arranged spaced by a prescribed interval (pitch) from each other, along sidewall portion 8. Further, a bottom portion 13 extends from wall-like body 10 to the inner side of base plate 3.

Figure 5:
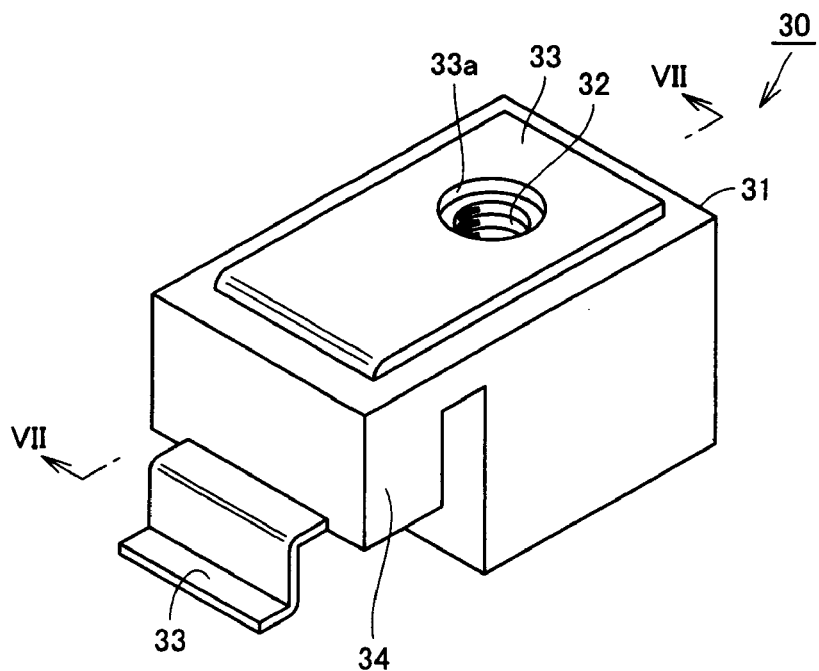
FIG. 5 is a perspective view showing a screw block terminal in accordance with the embodiment.
Figure 6:
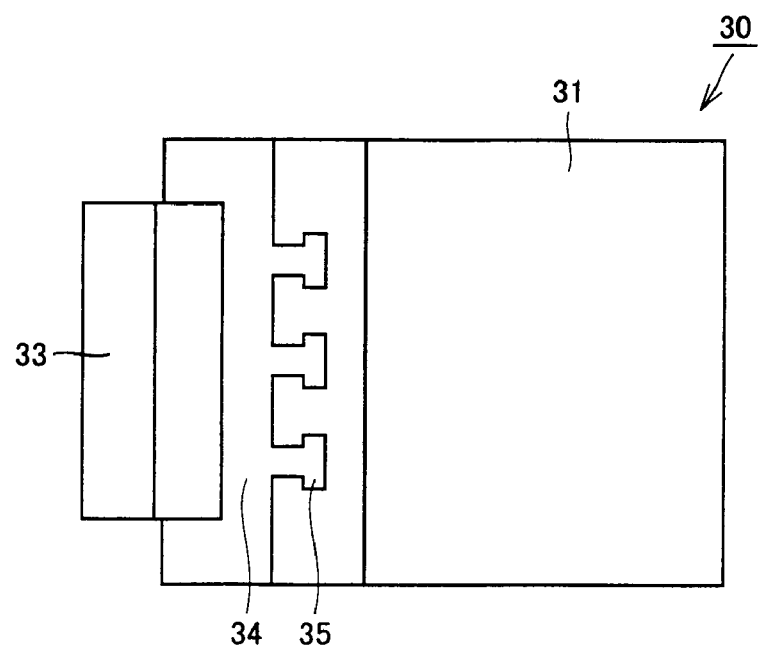
FIG. 6 is a bottom view of the screw block terminal in accordance with the embodiment.
Figure 7:
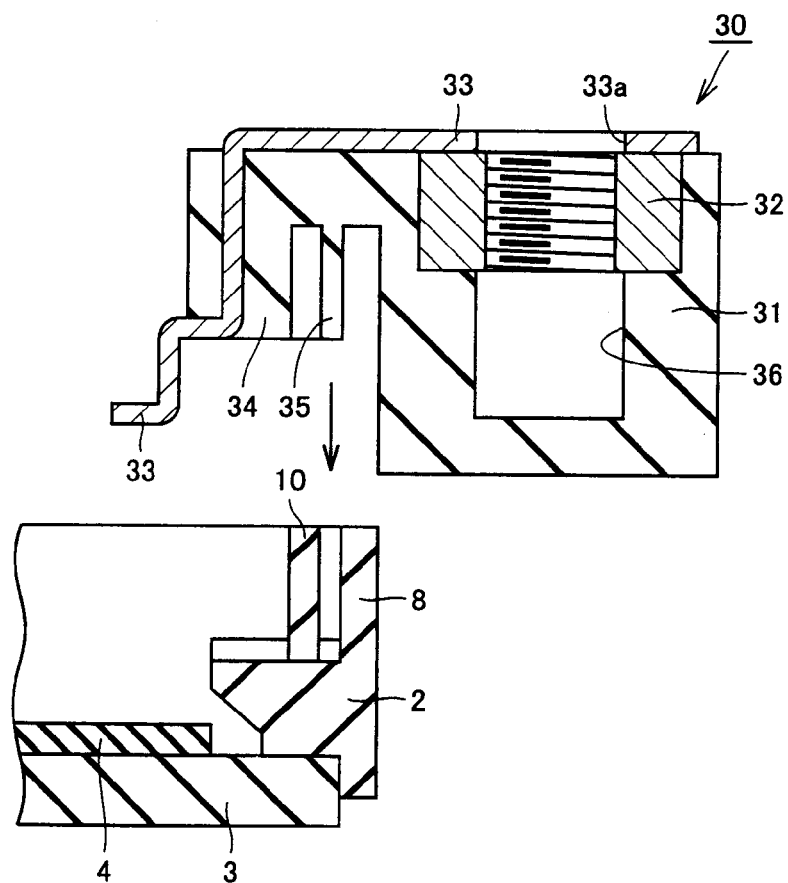
FIG. 7 is a partial cross-sectional view showing a structure for attaching the screw block terminal to the case member, taken along the section line VII-VII of FIG. 5.

As shown in FIG. 5, screw block terminal 30 is formed to have a block body 31, a nut 32, an electrode 33, and an overhang portion 34. Block body 31 has an approximately rectangular shape. Overhang portion 34 extends from a side surface of block body 31 such that overhang portion 34 and block body 31 sandwich the sidewall portion 8. As shown in FIG. 6, overhang portion 34 has a projection 35 that corresponds to the wall-like body 10 (see, for example, FIG. 3) provided on case member 2. As shown in FIG. 7, screw block terminal 30 is fixed on case member 2, by inserting projection 35 into the space between wall-like bodies 10.

Block body 31 has a hollow portion 36, and nut 32 is arranged at an upper part of hollow portion 36. One end of electrode 33 is exposed at a top surface portion of block body 31, and the other end passes through the inside of overhang portion 34 and is exposed at the lower end portion of overhang portion 34. On the one side of electrode 33, an opening 33a coaxial with nut 32 is formed. Block body 31 and overhang portion 34 of screw block terminal 30 are formed by molding resin, such as polyethyleneterephtalate or polybutylene terephtalate. A bus-bar (not shown), for example, is fixed by a screw or the like, on screw block terminal 30 fixed on case member 2.

Figure 8:
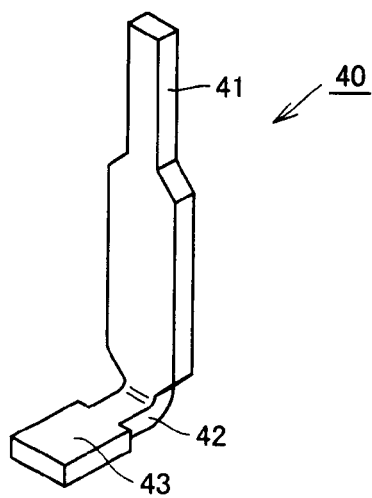
FIG. 8 is a perspective view showing a pin terminal in accordance with the embodiment.

As shown in FIG. 8, pin terminal 40 is formed to have a projection 41, a bent portion 42 and a pin terminal bottom portion 43. Projection 41 extends from one end of pin terminal bottom portion 43, almost vertical to pin terminal bottom portion 43. Bent portion 42 is the portion connecting pin terminal bottom portion 43 and projection 41. The width of bent portion 42 is set to correspond to the interval between wall bodies 11.

Pin terminal 40 is fixed on case member 2, by inserting bent portion 42 to a space between adjacent two wall bodies 11,11 of wall-like bodies 10 and fitting projection 41 in a space (region) surrounded by adjacent two wall-like bodies 10 and side wall portion 8. Here, pin terminal bottom portion 43 comes to be in contact with bottom portion 13 extending from wall-like body 10.

Figure 9:
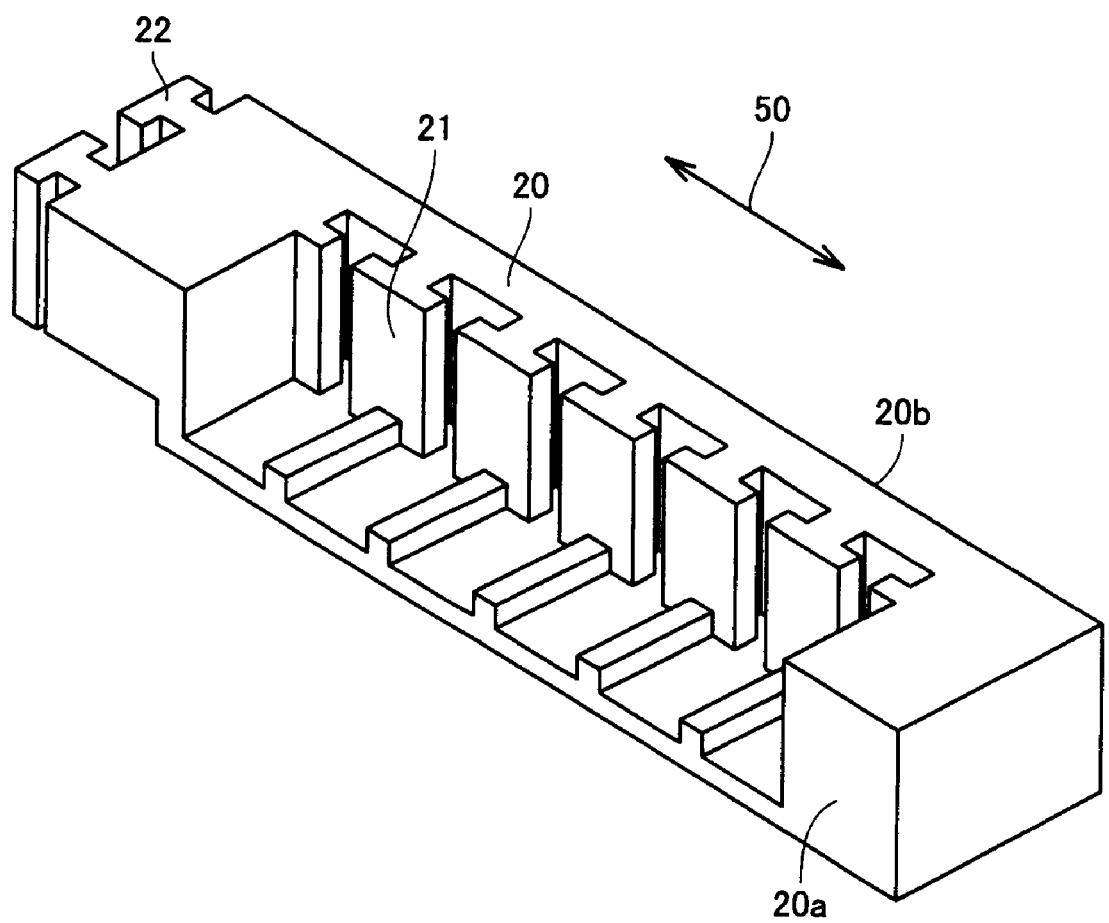
FIG. 9 is a perspective view showing a terminal attachment member in accordance with the embodiment.

Referring to FIG. 9, terminal attachment member 20 has a plurality of wall-like bodies 21 as terminal fixing portions, similar to wall-like bodies 10 (see FIG. 3) formed along sidewall portion 8, formed spaced by a distance from each other along the direction of extension (arrow 50) of terminal attachment member 20. The wall-like bodies 21 are formed on one side portion 20a, of one and the other side portions 20a and 20b extending opposite to each other. On one end along the direction of extension of terminal attachment member 20, a side fitting portion 22 is formed, which corresponds to the wall-like body 10. Terminal attachment member 20 is fixed on case member 2 by inserting the side fitting portion 22 to the space between sidewall portion 8 and wall-like bodies 10 and between wall-like bodies 10, 10 in the manner similar to the attachment of screw block terminal 30 (see FIG. 13).

Figure 10:
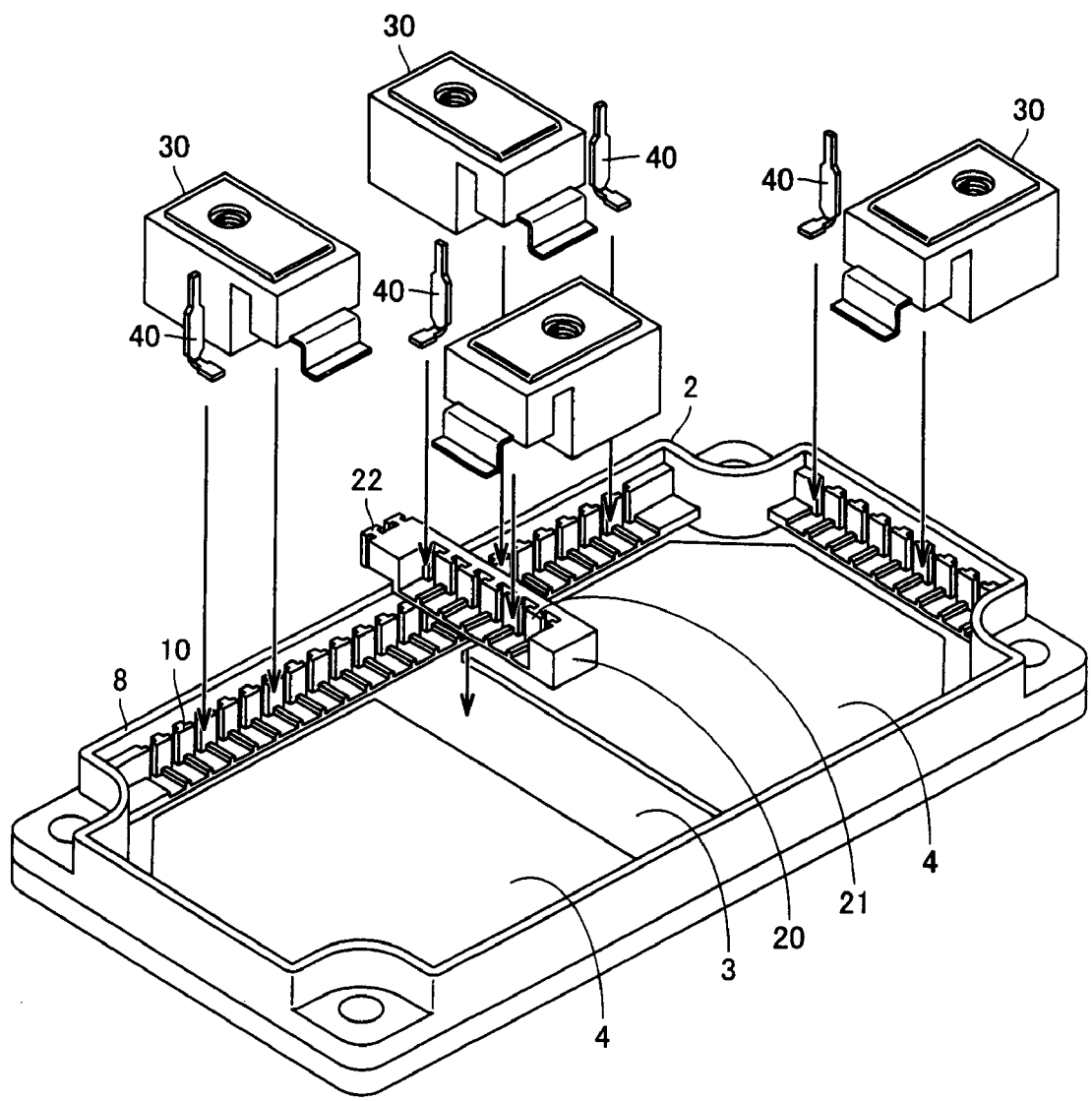
FIG. 10 is an exploded perspective view showing the manner of attaching the screw block terminal, the pin terminal and the terminal attachment member to the case member in accordance with the embodiment.
Figure 11:
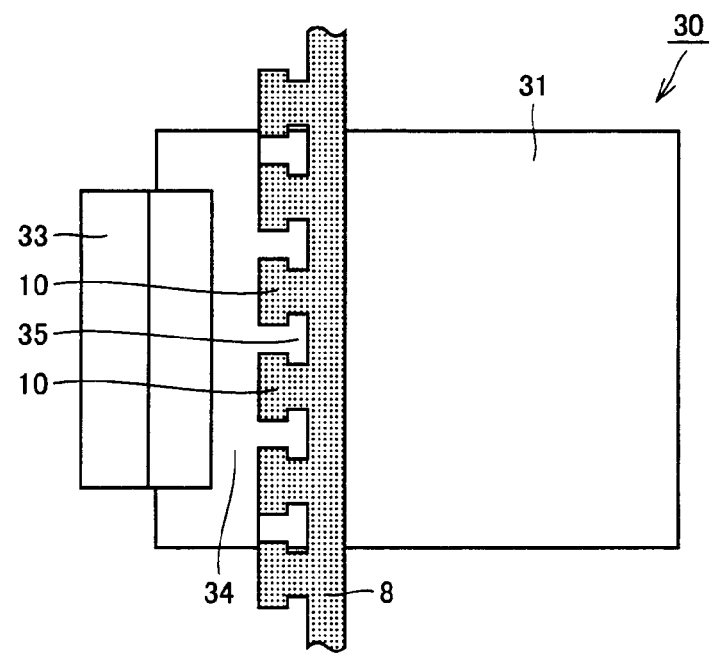
FIG. 11 is a bottom view showing the fit state of the screw block terminal and the wall-like body in accordance with the embodiment.

Next, the manner of attaching terminal attachment member 20, screw block terminal 30 and pin terminal 40 in semiconductor device 1 above will be described. Referring to FIG. 10, first, as to the screw block terminal 30 to be attached to sidewall portion 8, screw block terminal 30 is aligned to a prescribed position for attachment on sidewall portion 8. Then, as shown in FIG. 11, projection 35 of screw block terminal 30 is fit to the space between sidewall portion 8 and wall-like body 10 and between wall-like bodies 10, 10, whereby screw block terminal 30 is fixed at the prescribed position of case member 2. As to pin terminal 40, by inserting pin terminal 40 between two adjacent wall-like bodies 10, 10 at a prescribed position where the pin terminal 40 is to be attached, pin terminal 40 is fixed on case member 2.

Figure 12:
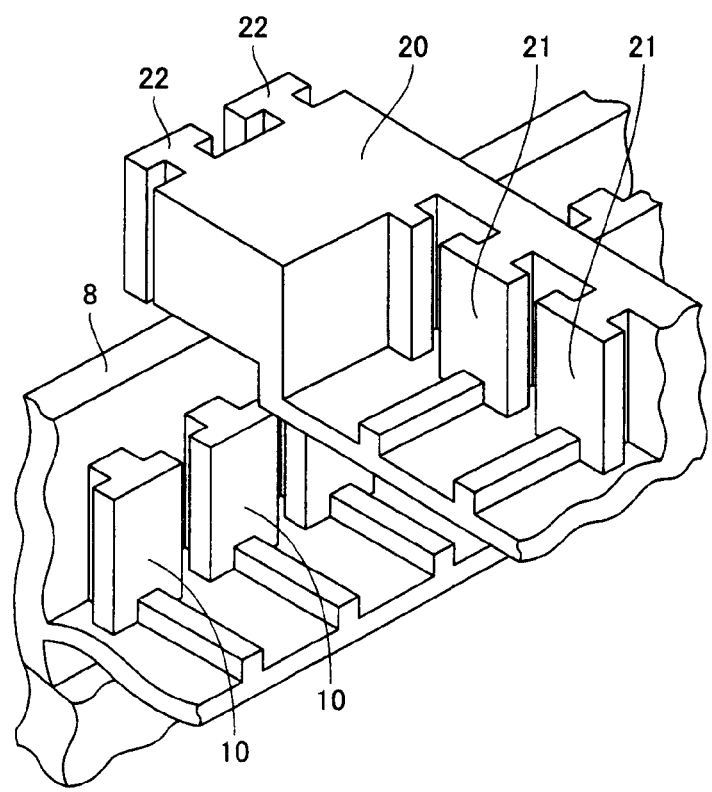
FIG. 12 is a partially enlarged perspective view showing attachment of the terminal attachment member to the wall-like body in accordance with the embodiment.
Figure 13:
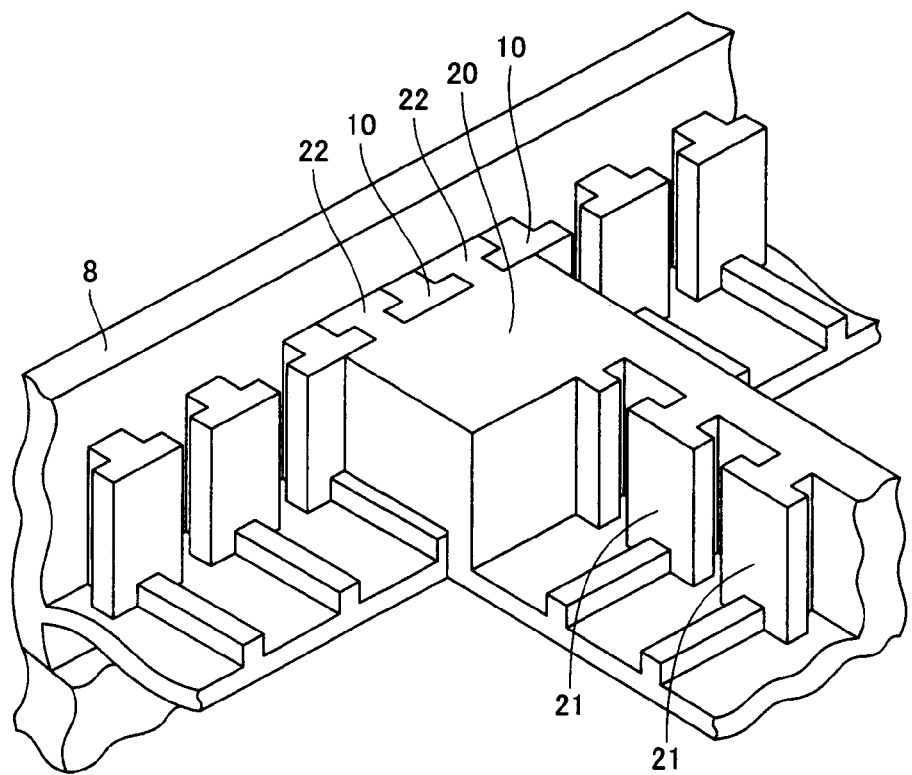
FIG. 13 is a partially enlarged perspective view showing the fit state of the terminal attachment member and the wall-like body in accordance with the embodiment.

As to screw block terminal 30 or pin terminal 40 to be attached in a region inside base plate 3, first, terminal attachment member 20 is attached to case member 2, and then, screw block terminal 30 or pin terminal 40 is fixed on the attached terminal attachment member 20. As shown in FIG. 12, first, side fitting portion 22 formed on one end of terminal attachment member 20 is aligned to a prescribed position for attachment. Next, the side fitting portion 22 is fit to the space between sidewall portion 8 and wall-like body 10 and between wall-like bodies 10, 10, whereby terminal attachment member 20 is attached to case member 2, as shown in FIG. 13.

Figure 14:
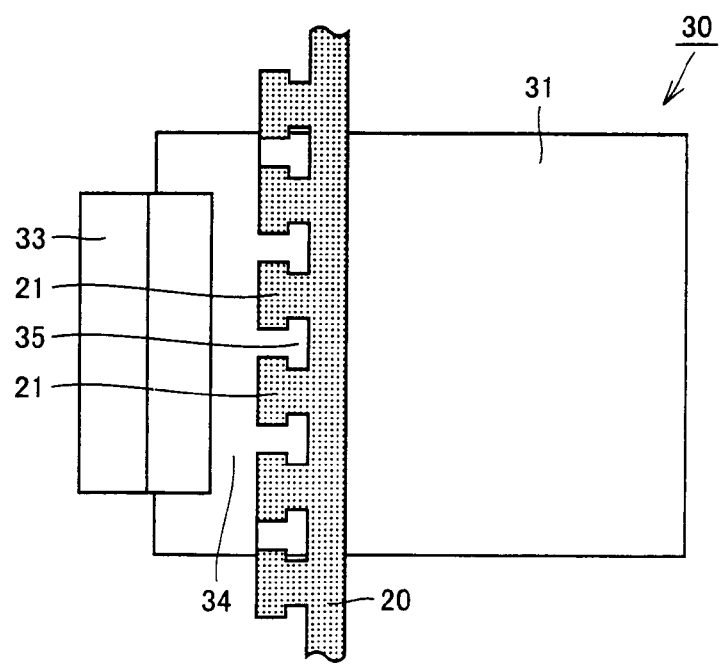
FIG. 14 is a bottom view showing the fit state of the screw block terminal and the terminal attachment member, in accordance with the embodiment.
Figure 15:
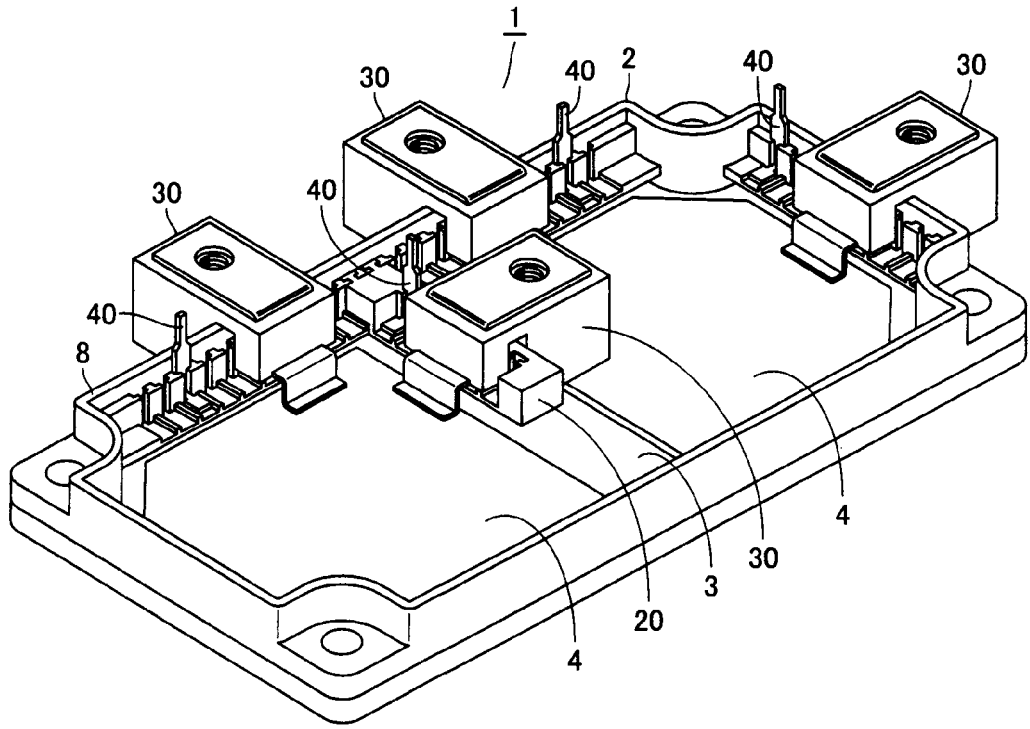
FIG. 15 is a perspective view showing a state in which attachment of the screw block terminal, the pin terminal and the terminal attachment member to the case member is completed, in accordance with the embodiment.

Next, to the prescribed position of the terminal attachment member 20 attached to case member 2, screw block terminal 30 is aligned (see FIG. 10), and projection 35 of screw block terminal 30 is fit to the space between wall-like bodies 21, 21 as shown in FIG. 14, whereby screw block terminal 30 is fixed on terminal attachment member 20. Further, by aligning pin terminal 40 at a prescribed position and by inserting pin terminal 40 between two adjacent wall-like bodies 21, 21 at the prescribed position, pin terminal 40 is fixed on terminal attachment member 20.

In this manner, screw block terminal 30 or pin terminal 40 is fixed on a prescribed position along sidewall portion 8 of case member 2 and, in addition, screw block terminal 30 or pin terminal 40 is fixed on terminal attachment member 20 fixed on a prescribed position.

Figure 16:
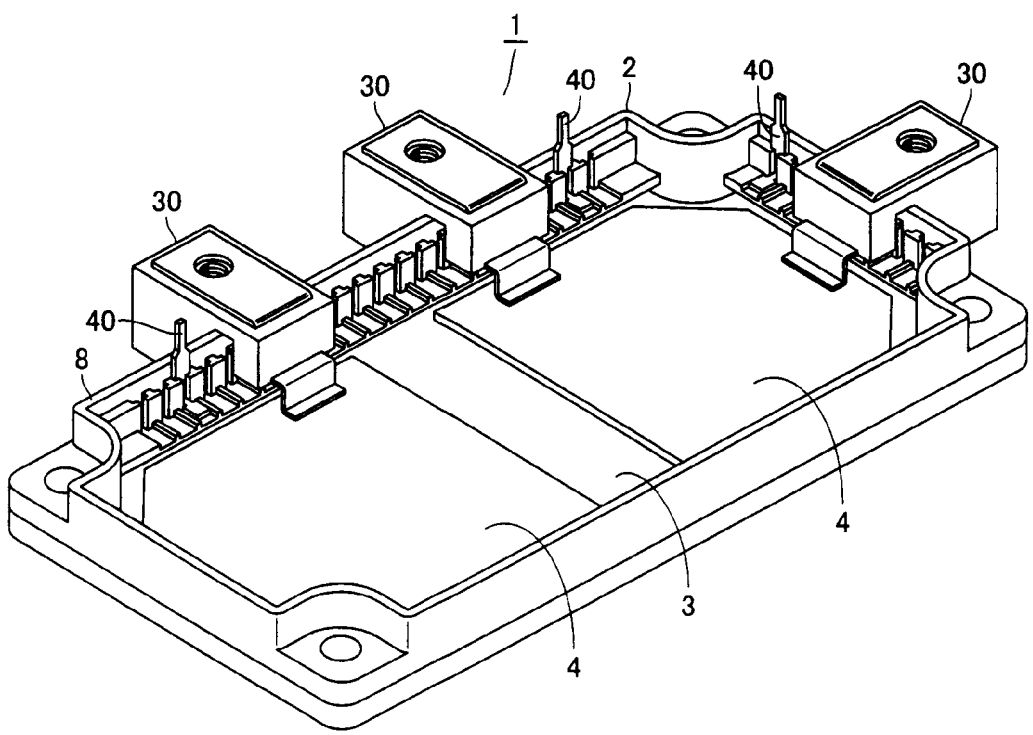
FIG. 16 is a perspective view of a semiconductor device in accordance with a comparative example.
Figure 17:
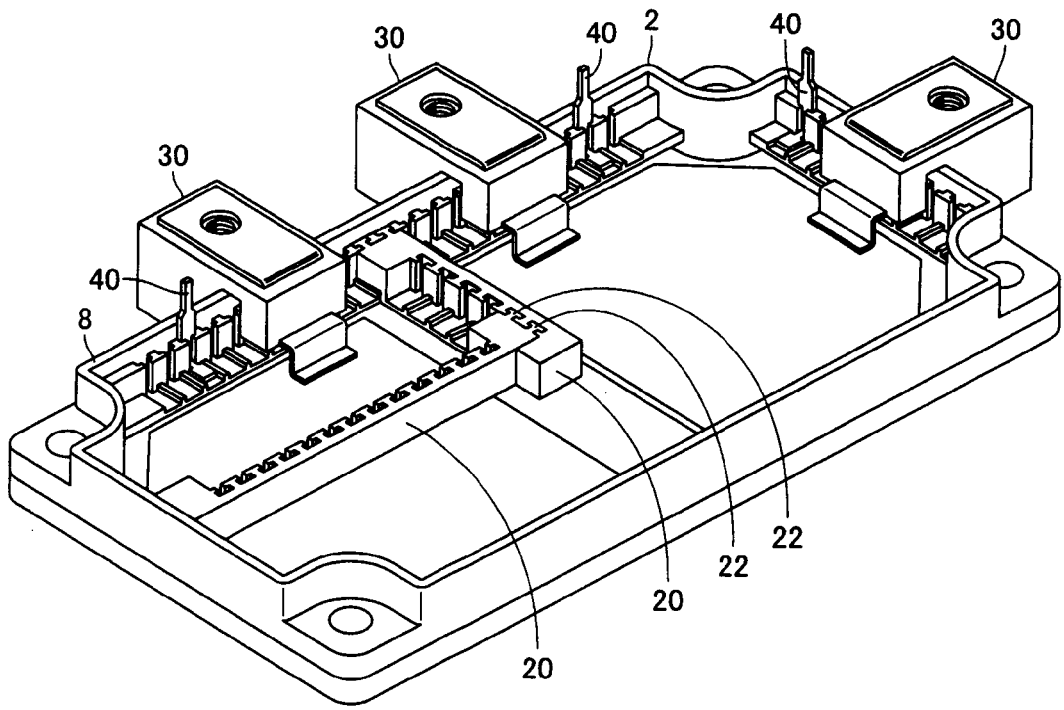
FIG. 17 is a perspective view of a semiconductor device in accordance with a modification of the embodiment.

In semiconductor device 1 described above, terminal attachment member 20 extending from sidewall portion 8 of case member 2 to the inner region is attached, and screw block terminal 30 or pin terminal 40 is fixed on terminal attachment member 20. As compared with semiconductor device 1 shown in FIG. 16 not having the terminal attachment member, the position for attaching screw block terminal 30 or pin terminal 40 is not limited to the outer peripheral portion along sidewall portion 8 of case member 2, and screw block terminal 30 or pin terminal 40 may be attached to a region inside of base plate 3.

As a result, the degree of freedom as to the position for attaching screw block terminal 30 or pin terminal 40 to case member 2 can be increased. Further, as terminal attachment member 20 has side fitting portion 22 that corresponds to the wall-like bodies 10 provided along sidewall portion 8, terminal attachment member 20 can be fixed easily on case member 2, without using any additional member.

An example of semiconductor device 1 in which one terminal attachment member 20 is attached to case member 2 has been described above. It is possible in semiconductor device 1 to have terminal attachment members connected to each other. By way of example, by fitting side fitting portion 22 of one terminal attachment member 20 between wall-like portions 21, 21 of another terminal attachment member 20, terminal attachment members 20, 20 can be coupled to each other, and the degree of freedom in the position of attachment of screw block terminal 30 or pin terminal 40 can further be increased.

Embodiment 2

In the semiconductor device described above, a terminal attachment member having wall-like bodies formed on one side portion of one and the other side portions opposite to each other has been described as an example. In Embodiment 2, a variation of the terminal attachment member will be described.

Figure 18:
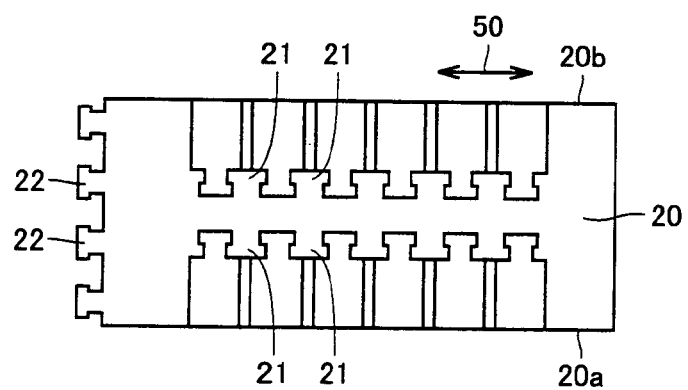
FIG. 18 is a top view showing the terminal attachment member applied to the semiconductor device in accordance with Embodiment 2 of the present invention.
Figure 19:
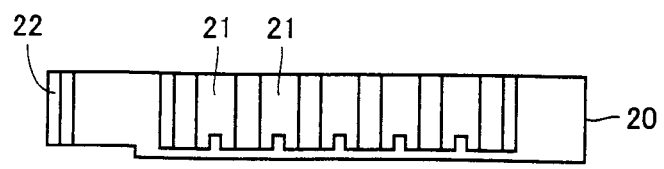
FIG. 19 is a side view of the terminal attachment member shown in FIG. 18, in accordance with the embodiment.

Referring to FIGS. 18 and 19, terminal attachment member 20 of the semiconductor device has a plurality of wall-like bodies 21 formed with a prescribed interval from each other along the direction of extension (arrow 50), on each of one and the other side portions 20a and 20b extending opposite to each other. Further, each wall-like body 21 is formed such that positions along the direction of extension of wall-like bodies 21 formed on one side portion 20a match the positions along the direction of extension of wall-like bodies 21 formed on the other side portion 20b. On one end of terminal attachment member 20 along the direction of extension, side fitting portion 22 is formed, which corresponds to wall-like bodies 10, for attachment to sidewall portion 8. Except for these points, the structure is the same as that of the semiconductor device described above, and therefore, corresponding portions are denoted by the same reference characters and description thereof will not be repeated.

Figure 20:
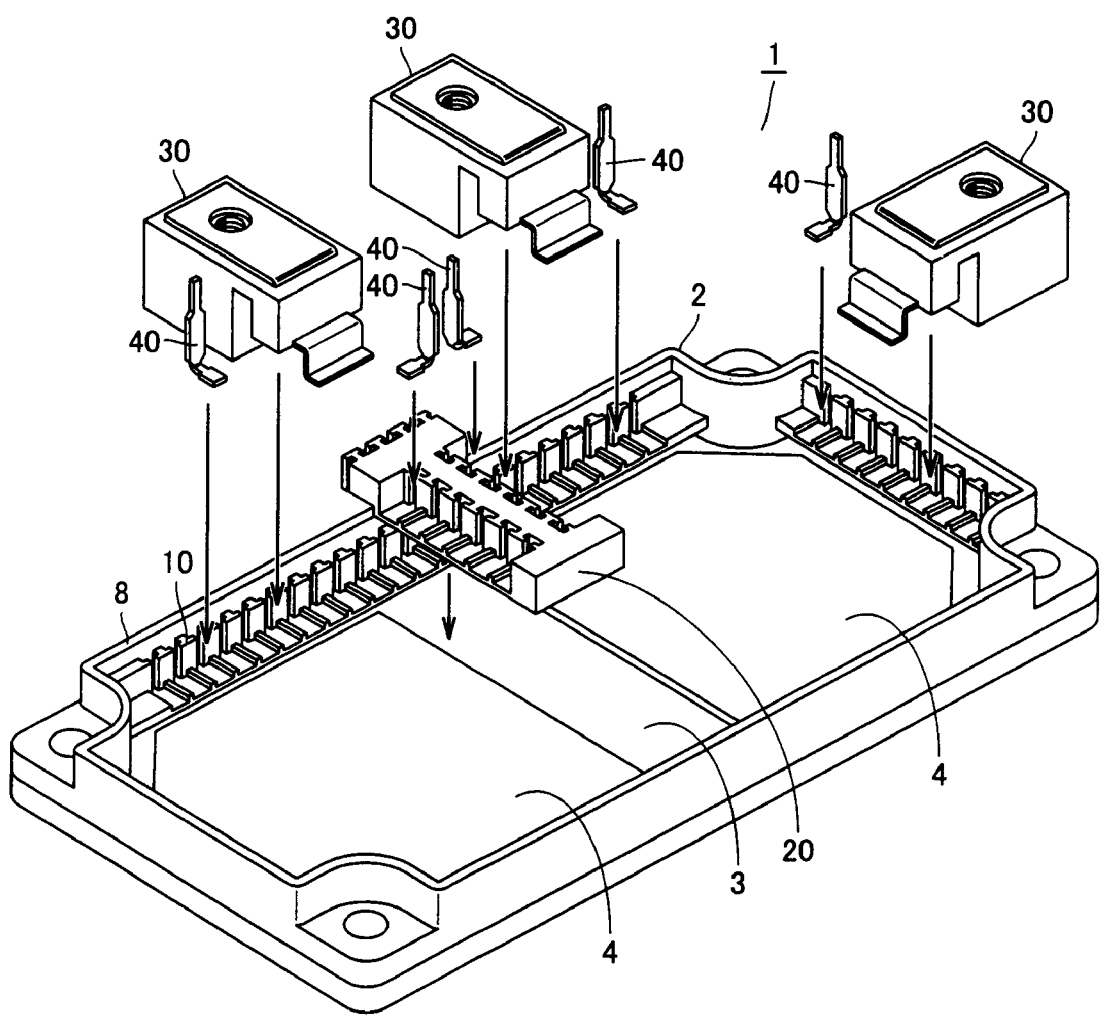
FIG. 20 is an exploded perspective view showing the manner of attaching the screw block terminal, the pin terminal and the terminal attachment member to the case member in accordance with the embodiment.

Next, the manner of attaching terminal attachment member 20 and the like in semiconductor device 1 above will be described. Referring to FIG. 20, screw block terminal 30 and pin terminal 40 attached to sidewall portion 8 are fixed in the similar manner as described above.

As to pin terminal 40 or screw block terminal 30 to be attached in a region inside base plate 3, first, terminal attachment member 20 is attached to case member 2, and then, pin terminal 40 or the like is fixed on the attached terminal attachment member 20. First, side fitting portion 22 formed on one end of terminal attachment member 20 is aligned to a prescribed position for attachment, and side fitting portion 22 is fit to the space between sidewall portion 8 and wall-like body 10 and between wall-like bodies 10, 10, whereby terminal attachment member 20 is attached to case member 2.

Figure 21:
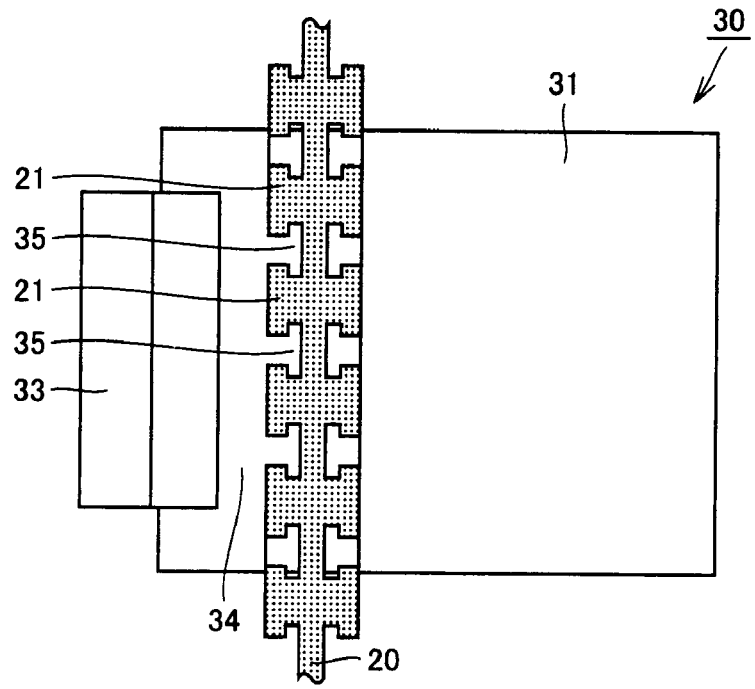
FIG. 21 is a bottom view showing the fit state of the screw block terminal and the terminal attachment member in accordance with the embodiment.

Next, pin terminal 40 is aligned to a prescribed position of terminal attachment member 20 attached to case member 2, and pin terminal 40 is inserted between two adjacent wall-like bodies 21, 21 at the prescribed position, whereby pin terminal 40 is fixed on terminal attachment member 20. As to screw block terminal 30, projection 35 of screw block terminal 30 is fitted to a space between wall-like bodies 21, 21 formed on the one or the other side portion, whereby screw block terminal 30 is fixed on terminal attachment member 20, as shown in FIG. 21. Though the state in which screw block terminal 30 is attached is not shown for simplicity in FIG. 20, screw block terminal 30 may be attached to terminal attachment member 20 in the similar manner as shown, for example, in FIG. 1.

Figure 22:
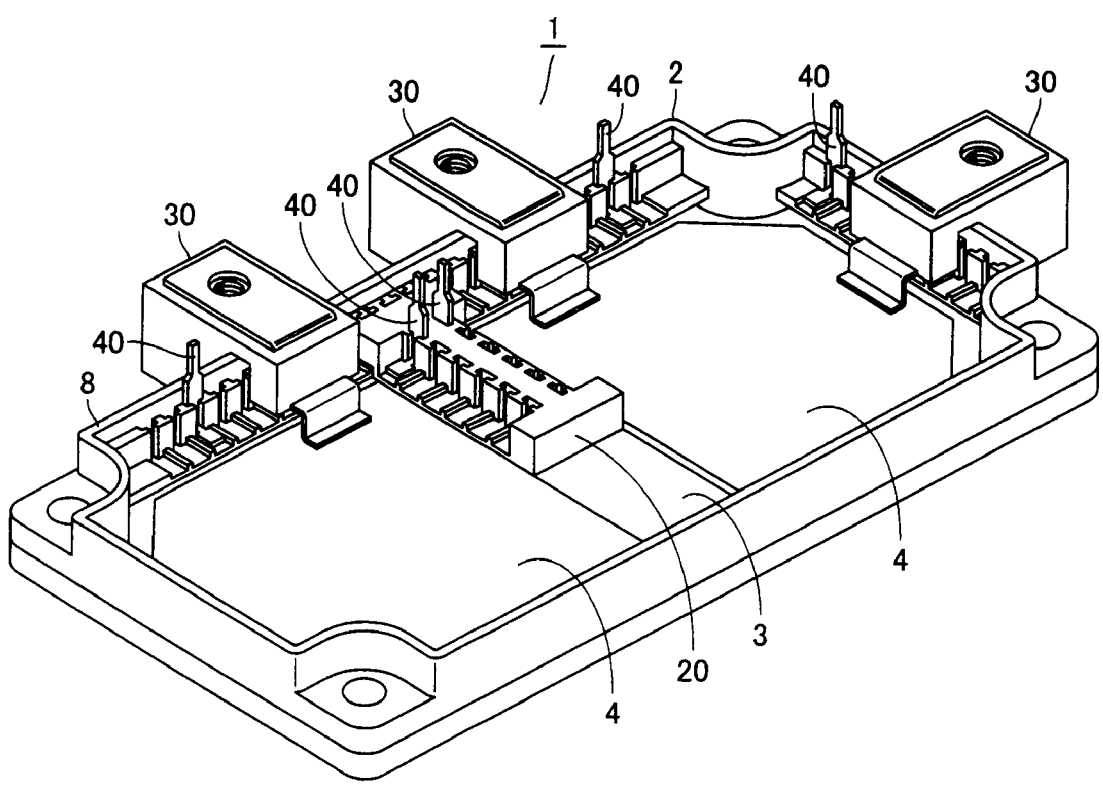
FIG. 22 is a perspective view showing a state in which attachment of the screw block terminal, the pin terminal and the terminal attachment member to the case member is completed, in accordance with the embodiment.

In this manner, terminal attachment member 20 is attached to a prescribed position of case member 2, and screw block terminal 30 (see FIG. 21) or pin terminal 40 is fixed on the attached terminal attachment member 20, whereby screw block terminal 30 or pin terminal 40 can be attached to a region inside the base plate 3, as shown in FIG. 22.

In semiconductor device 1 above, a plurality of wall-like bodies 21 are formed, spaced by a prescribed interval from each other, along the direction of extension, on each of one and the other side portions 20a and 20b extending opposite to each other (see FIG. 18). Consequently, it becomes possible to further increase the degree of freedom in arranging screw block terminal 30 and pin terminal 40, in accordance with the position of semiconductor mounting board 4.

Figure 23:
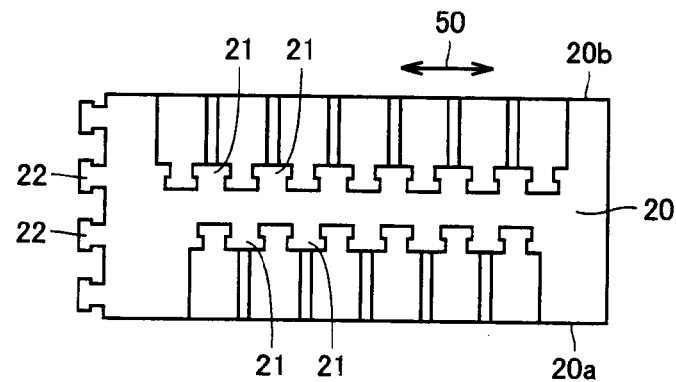
FIG. 23 is a top view showing a modification of the terminal attachment member applied to the semiconductor device in accordance with the embodiment.

In semiconductor device 1 above, terminal attachment member 20 having wall-like bodies 21 formed such that positions along the direction of extension of wall-like bodies 21 formed on one side portion 20a match the positions along the direction of extension of wall-like bodies 21 formed on the other side portion 20b has been described as an example (see FIG. 18, arrow 50). Other than the terminal attachment member 20 as described above, a terminal attachment member in which positions along the direction of extension (arrow 50) of wall-like bodies 21 formed on one side portion 20a are different from positions along the direction of extension of wall-like bodies 21 formed on the other side portion 20b, such as shown in FIG. 23, may be applied.

Embodiment 3

Figure 24:
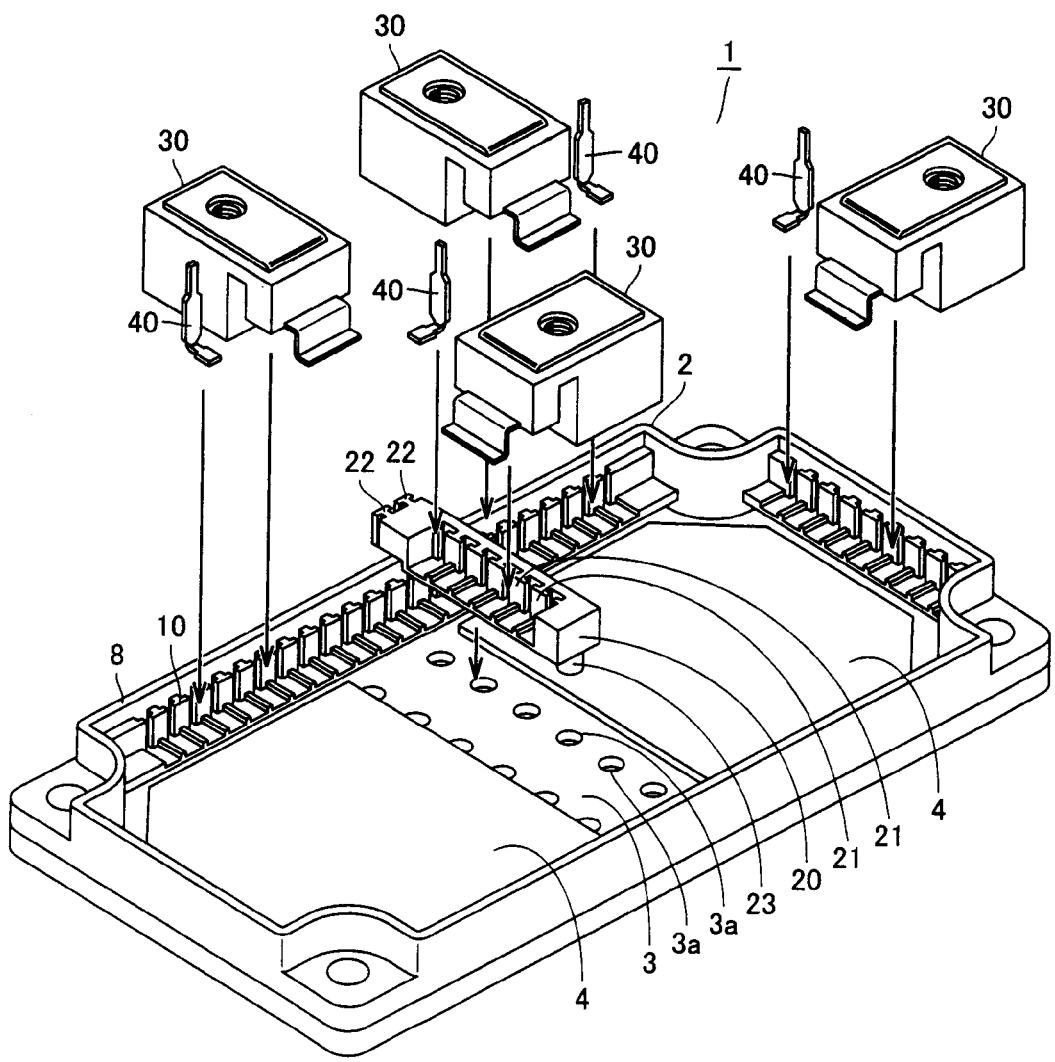
FIG. 24 is an exploded perspective view showing the manner of attaching the screw block terminal, the pin terminal and the terminal attachment member to the case member in accordance with Embodiment 3 of the present invention.

In Embodiment 3, another variation of the terminal attachment member will be described. As shown in FIG. 24, terminal attachment member 20 of semiconductor device 1 has a bottom projection 23 at the bottom surface to be in contact with base plate 3 of case member 2. Base plate 3 has an opening 3a to which the bottom projection fits. Except for these points, the structure is the same as that of the semiconductor device described above, and therefore, corresponding portions are denoted by the same reference characters and description thereof will not be repeated.

Next, the manner of attaching terminal attachment member 20 and the like in semiconductor device 1 will be described. Referring to FIG. 24, screw block terminal 30 or pin terminal 40 to be attached to sidewall portion 8 is fixed in the similar manner as described above.

As to screw block terminal 30 or pin terminal 40 to be attached in a region inside base plate 3, first, terminal attachment member 20 is attached to case member 2, and then, screw block terminal 30 or pin terminal 40 is fixed on the attached terminal attachment member 20. First, side fitting portion 22 formed on one end of terminal attachment member 20 is aligned to a prescribed position for attachment, the side fitting portion 22 is fit to the space between sidewall portion 8 and wall-like body 10 and between wall-like bodies 10, 10, and bottom projection 23 of terminal attachment member 20 is fit to opening 3a of base plate 3, whereby terminal attachment member 20 is attached to case member 2.

Next, to the prescribed position of the terminal attachment member 20 attached to case member 2, screw block terminal 30 is aligned, and projection 35 of screw block terminal 30 is fit to the space between wall-like bodies 21, 21 (see FIG. 14), whereby screw block terminal 30 is fixed on terminal attachment member 20. Further, by aligning pin terminal 40 at a prescribed position and by inserting pin terminal 40 between two adjacent wall-like bodies 21, 21 at the prescribed position, pin terminal 40 is fixed on terminal attachment member 20.

Figure 25:
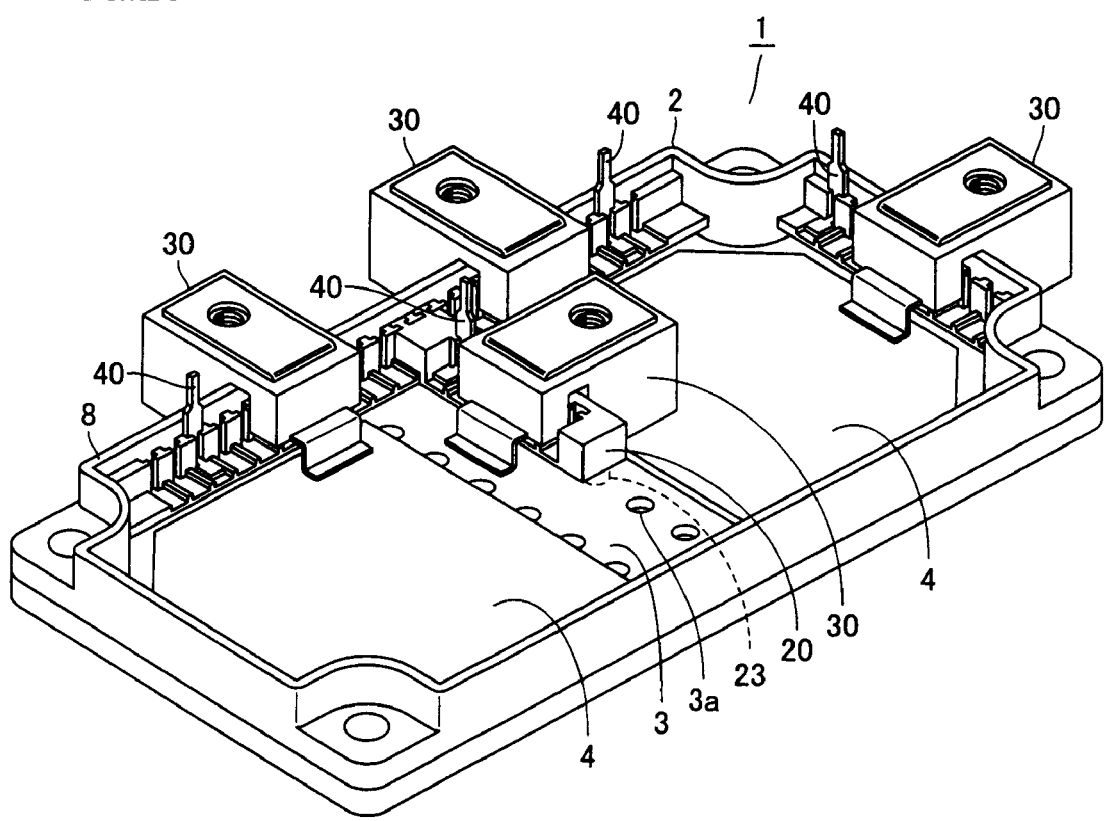
FIG. 25 is a perspective view showing a state in which attachment of the screw block terminal, the pin terminal and the terminal attachment member to the case member is completed, in accordance with the embodiment.

In this manner, terminal attachment member 20 is attached to a prescribed position of case member 2, and screw block terminal 30 or pin terminal 40 is fixed on the attached terminal attachment member 20, whereby screw block terminal 30 or pin terminal 40 can be attached to a region inside the base plate 3, as shown in FIG. 25.

Semiconductor device 1 described above attains the effect of increasing degree of freedom in arranging screw block terminal 30 or pin terminal 40 and, in addition, attains the following effect. Specifically, bottom projection 23 is provided on the bottom surface, which is in contact with base plate 3, of terminal attachment member 20, and opening 3a is formed in base plate 3 to which the bottom projection 23 fits, whereby terminal attachment member 20 can more firmly be fixed on case member 2.

In the semiconductor device above, an example in which bottom projection 23 is formed on terminal attachment member 20 and fitting opening 3a for the bottom projection 23 is formed in base plate 3 has been described. Alternatively, a projection may be formed on base plate 3, and a recessed portion to which the projection fits, may be formed at the bottom of the terminal attachment member.

Embodiment 4

Figure 26:
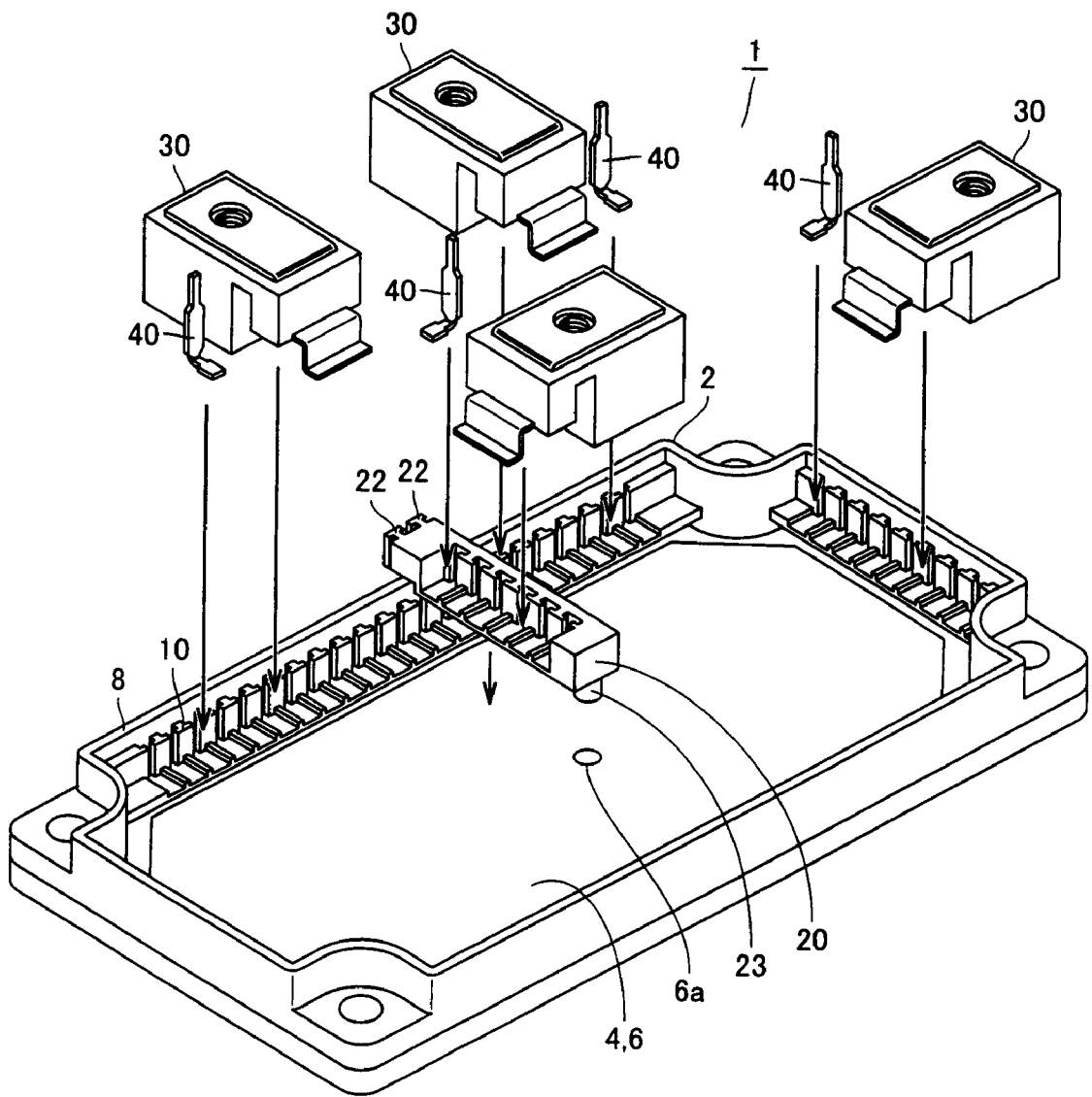
FIG. 26 is an exploded perspective view showing the manner of attaching the screw block terminal, the pin terminal and the terminal attachment member to the case member in accordance with Embodiment 4 of the present invention.

In Embodiment 4, a further variation of the terminal attachment member will be described. As shown in FIG. 26, terminal attachment member 20 of semiconductor device 1 has bottom projection 23 at the bottom surface to be in contact with semiconductor mounting board 4 placed on base plate 3. Insulating substrate 6 of semiconductor mounting board 4 has an opening 6a to which the bottom projection 23 fits. Except for these points, the structure is the same as that of the semiconductor device described above, and therefore, corresponding portions are denoted by the same reference characters and description thereof will not be repeated.

Next, the manner of attaching terminal attachment member 20 and the like in semiconductor device 1 will be described. Referring to FIG. 26, screw block terminal 30 or pin terminal 40 to be attached to sidewall portion 8 is fixed in the similar manner as described above.

As to screw block terminal 30 or pin terminal 40 to be attached in a region inside base plate 3, first, terminal attachment member 20 is attached to case member 2, and then, screw block terminal 30 or pin terminal 40 is fixed on the attached terminal attachment member 20. First, side fitting portion 22 formed on one end of terminal attachment member 20 is aligned to a prescribed position for attachment, the side fitting portion 22 is fit to the space between sidewall portion 8 and wall-like body 10 and between wall-like bodies 10, 10, and bottom projection 23 of terminal attachment member 20 is fit to opening 6a of insulating substrate 6, whereby terminal attachment member 20 is attached to case member 2.

Next, to the prescribed position of the terminal attachment member 20 attached to case member 2, screw block terminal 30 is aligned, and projection 35 of screw block terminal 30 is fit to the space between wall-like bodies 21, 21 (see FIG. 14), whereby screw block terminal 30 is fixed on terminal attachment member 20. Further, by aligning pin terminal 40 at a prescribed position and by inserting pin terminal 40 between two adjacent wall-like bodies 21, 21 at the prescribed position, pin terminal 40 is fixed on terminal attachment member 20.

Figure 27:
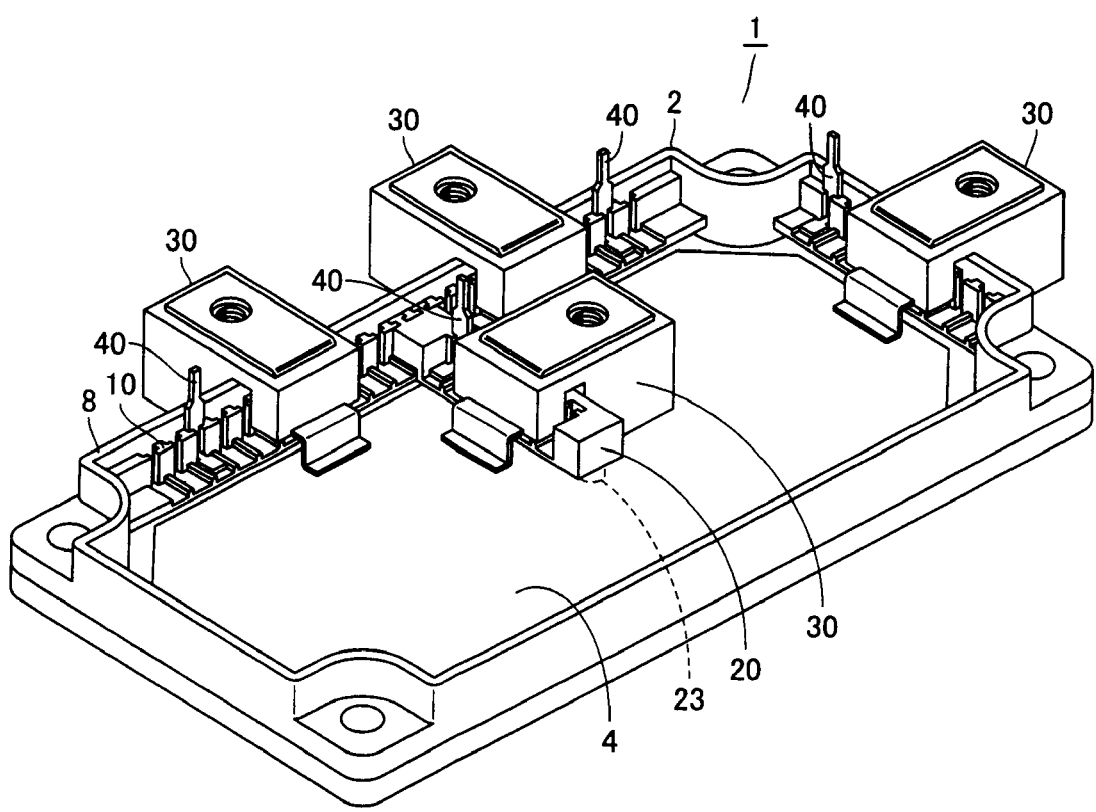
FIG. 27 is a perspective view showing a state in which attachment of the screw block terminal, the pin terminal and the terminal attachment member to the case member is completed, in accordance with the embodiment.

In this manner, terminal attachment member 20 is attached to a prescribed position of case member 2, and screw block terminal 30 or pin terminal 40 is fixed on the attached terminal attachment member 20, whereby screw block terminal 30 or pin terminal 40 can be attached to a region inside the base plate 3, as shown in FIG. 27.

Semiconductor device 1 described above attains the effect of increasing degree of freedom in arranging screw block terminal 30 or pin terminal 40 and, in addition, attains the following effect. Specifically, bottom projection 23 is provided on the bottom surface, which is in contact with semiconductor mounting board 4, of terminal attachment member, and opening 6a to which bottom projection 23 fits is formed in insulating substrate 6 of semiconductor mounting board 4, whereby terminal attachment member 20 can more firmly be fixed on case member 2, even when base plate 3 is covered by semiconductor mounting board 4.

In the semiconductor device above, an example in which bottom projection 23 is formed on terminal attachment member 20 and fitting opening 6a for the bottom projection 23 is formed in insulating substrate 6 has been described. Alternatively, a projection may be formed on insulating substrate 6, and a recessed portion to which the projection fits, may be formed at the bottom of the terminal attachment member.

Embodiment 5

Figure 28:
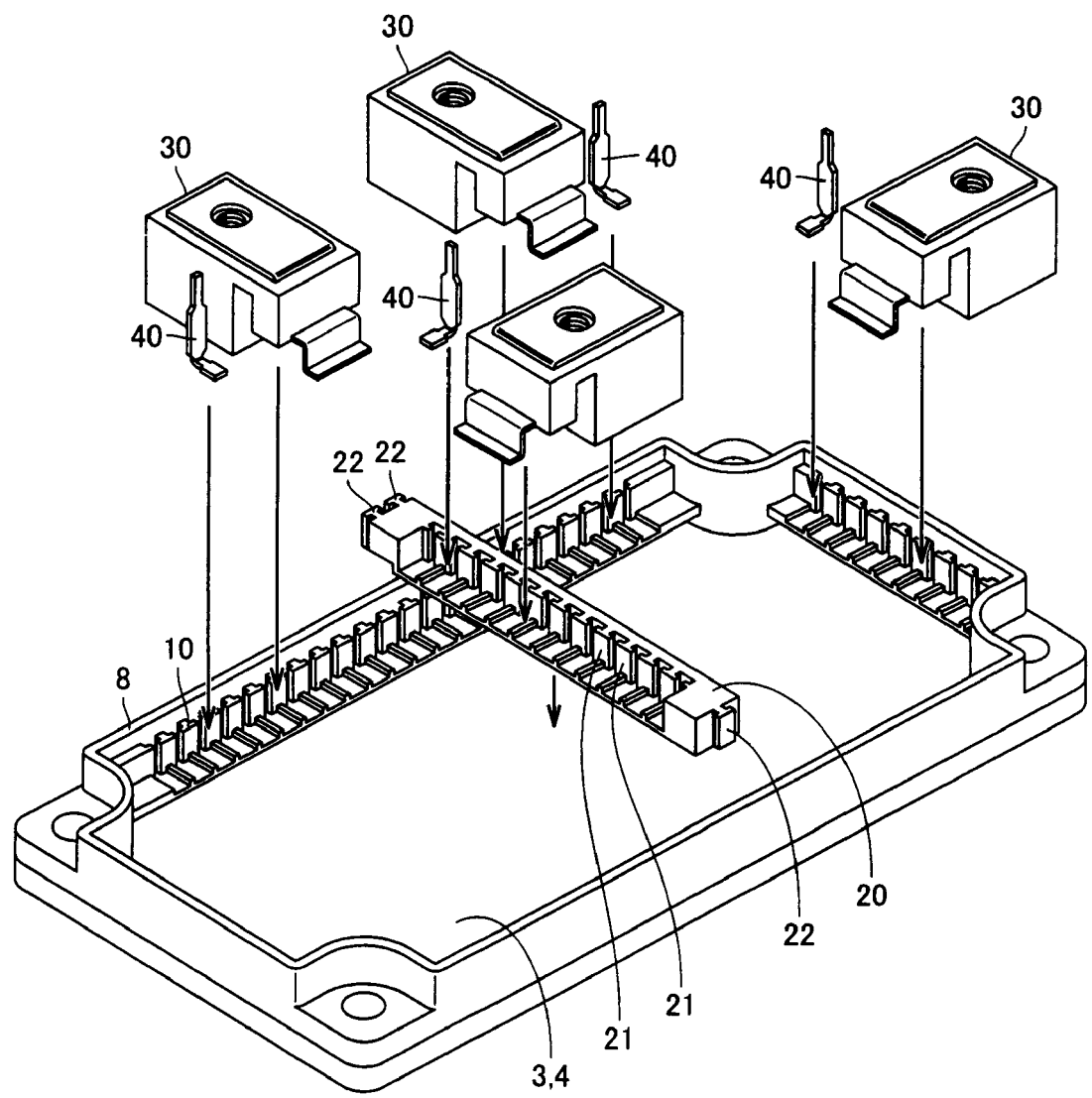
FIG. 28 is an exploded perspective view showing the manner of attaching the screw block terminal, the pin terminal and the terminal attachment member to the case member in accordance with Embodiment 5 of the present invention.

In Embodiment 5, a further variation of the terminal attachment member will be described. As shown in FIG. 28, terminal attachment member 20 of semiconductor device 1 has side fitting portions 22 corresponding to wall-like bodies 10 respectively formed on the one and the other ends along the direction of extension of terminal attachment member 20. Except for these points, the structure is the same as that of the semiconductor device described above, and therefore, corresponding portions are denoted by the same reference characters and description thereof will not be repeated.

Next, the manner of attaching terminal attachment member 20 and the like in semiconductor device 1 will be described. Referring to FIG. 28, screw block terminal 30 or pin terminal 40 to be attached to sidewall portion 8 is fixed in the similar manner as described above.

As to screw block terminal 30 or pin terminal 40 to be attached in a region inside base plate 3, first, terminal attachment member 20 is attached to case member 2, and then, screw block terminal 30 or pin terminal 40 is fixed on the attached terminal attachment member 20. First, side fitting portion 22 formed on one end and side fitting portion 22 formed on the other end of terminal attachment member 20 are aligned to prescribed positions for attachment, the side fitting portion 22 on one end is fit to the space between sidewall portion 8 and wall-like body 10 and between wall-like bodies 10, 10, and the side fitting portion on the other end is fit to the space between sidewall portion 8 and wall-like body 10 and between wall-like bodies 10, 10, whereby terminal attachment member 20 is attached to case member 2. Thus, terminal attachment member 20 is attached bridging opposite sidewall portions 8, across base plate 3 or semiconductor mounting board 4.

Next, to the prescribed position of the terminal attachment member 20 attached to case member 2, screw block terminal 30 is aligned, and projection 35 of screw block terminal 30 is fit to the space between wall-like bodies 21, 21 (see FIG. 14), whereby screw block terminal 30 is fixed on terminal attachment member 20. Further, by aligning pin terminal 40 at a prescribed position and by inserting pin terminal 40 between two adjacent wall-like bodies 21, 21 at the prescribed position, pin terminal 40 is fixed on terminal attachment member 20.

Figure 29:
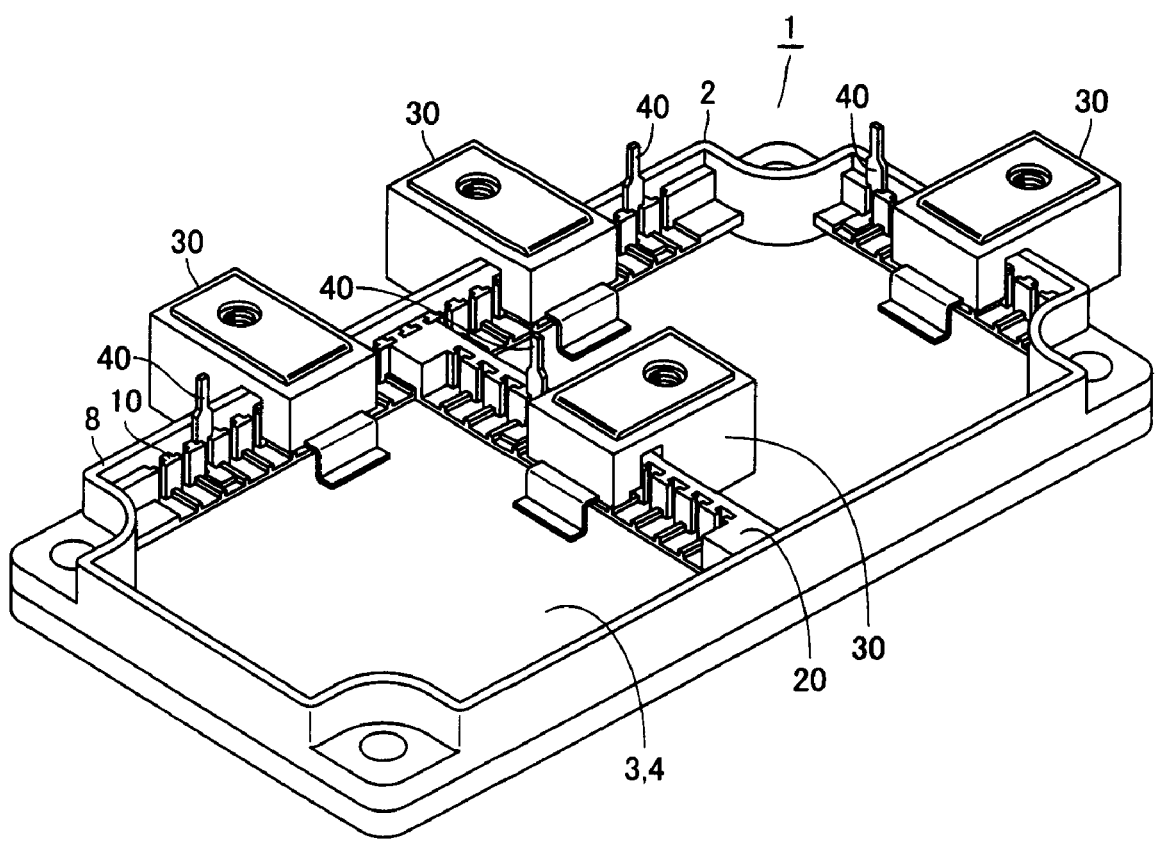
FIG. 29 is a perspective view showing a state in which attachment of the screw block terminal, the pin terminal and the terminal attachment member to the case member is completed, in accordance with the embodiment.

In this manner, terminal attachment member 20 is attached to a prescribed position of case member 2, and screw block terminal 30 or pin terminal 40 is fixed on the attached terminal attachment member 20, whereby screw block terminal 30 or pin terminal 40 can be attached to a region inside the base plate 3, as shown in FIG. 29.

Semiconductor device 1 described above attains the effect of increasing degree of freedom in arranging screw block terminal 30 or pin terminal 40 and, in addition, attains the following effect. Specifically, terminal attachment member 20 has side fitting portions 22 corresponding to wall-like bodies 10, respectively formed on the one and the other ends along the direction of extension of terminal attachment member 20, to be fixed on case member 2, whereby terminal attachment member 20 can more firmly be fixed on case member 2, even when a structure that fits to base plate 3 or semiconductor mounting board 4 cannot be provided.

Embodiment 6

Figure 30:
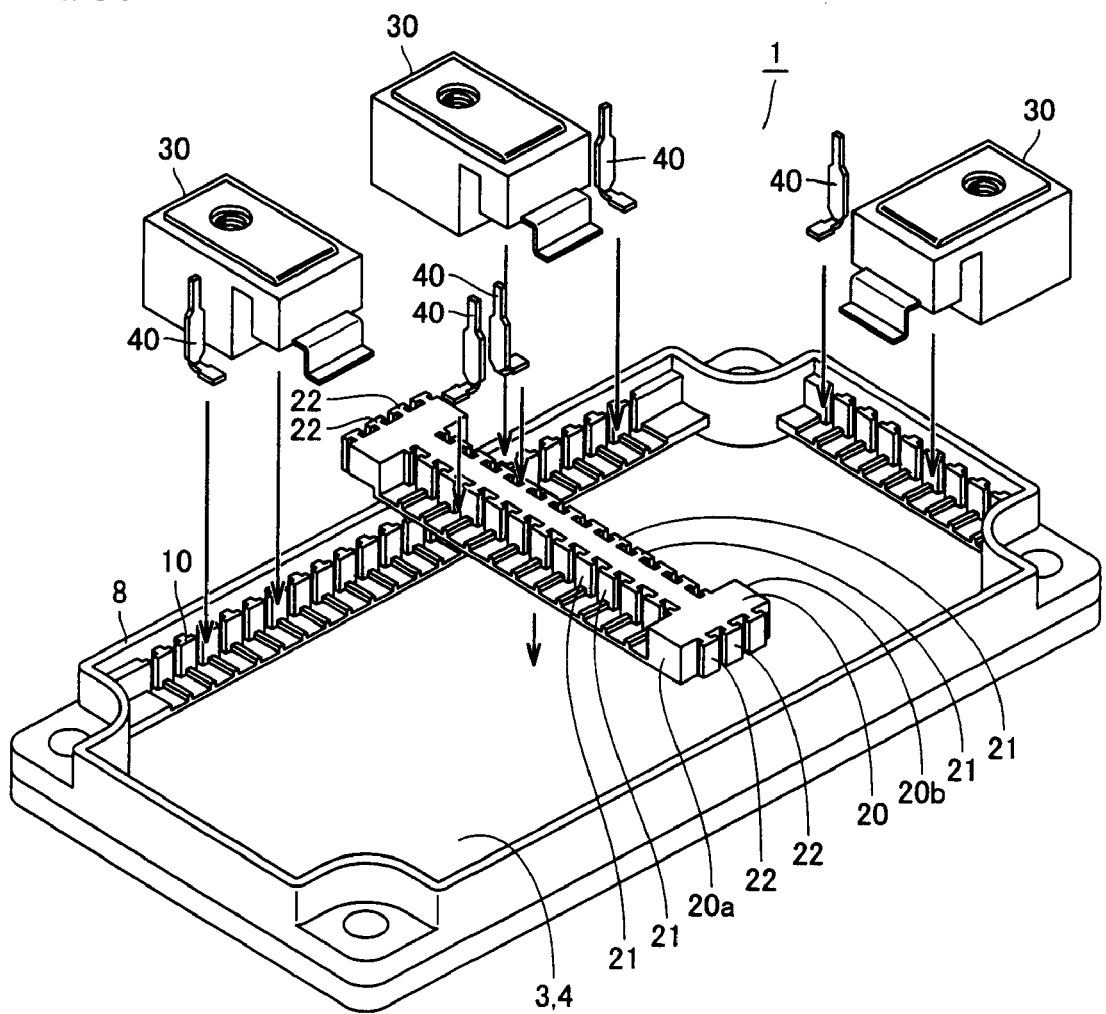
FIG. 30 is an exploded perspective view showing the manner of attaching the screw block terminal, the pin terminal and the terminal attachment member to the case member in accordance with Embodiment 6 of the present invention.

In Embodiment 6, a further variation of the terminal attachment member will be described. As shown in FIG. 30, terminal attachment member 20 of semiconductor device 1 has side fitting portions 22 corresponding to wall-like bodies 10 respectively formed on the one and the other ends along the direction of extension of terminal attachment member 20, and further has a plurality of wall-like bodies 21 formed spaced by a prescribed interval from each other along the direction of extension on one and the other side portions 20a and 20b extending opposite to each other, respectively. Except for these points, the structure is the same as that of the semiconductor device described above, and therefore, corresponding portions are denoted by the same reference characters and description thereof will not be repeated.

Next, the manner of attaching terminal attachment member 20 and the like in semiconductor device 1 will be described. Referring to FIG. 30, screw block terminal 30 or pin terminal 40 to be attached to sidewall portion 8 is fixed in the similar manner as described above.

As to pin terminal 40 or the like to be attached in a region inside base plate 3, first, terminal attachment member 20 is attached to case member 2, and then, pin terminal 40 or the like is fixed on the attached terminal attachment member 20. First, side fitting portion 22 formed on one end and side fitting portion 22 formed on the other end of terminal attachment member 20 are aligned to prescribed positions for attachment, the side fitting portion 22 on one end is fit to the space between sidewall portion 8 and wall-like body 10 and between wall-like bodies 10, 10, and the side fitting portion on the other end is fit to the space between sidewall portion 8 and wall-like body 10 and between wall-like bodies 10, 10, whereby terminal attachment member 20 is attached to case member 2.

Next, pin terminal 40 is aligned to a prescribed position of terminal attachment member 20 attached to case member 2, and pin terminal 40 is inserted between two adjacent wall-like bodies 21, 21 at the prescribed position, whereby pin terminal 40 is fixed on terminal attachment member 20. As to screw block terminal 30, projection 35 of screw block terminal 30 is fitted in a space between wall-like bodies 21, 21 formed on the one side portion 20a or the other side portion 20b, whereby screw block terminal 30 is fixed on terminal attachment member 20 (see FIG. 21). Though screw block terminal 30 is not shown for simplicity in FIG. 30, screw block terminal 30 may be attached to terminal attachment member 20 in the similar manner as shown in FIG. 29.

Figure 31:
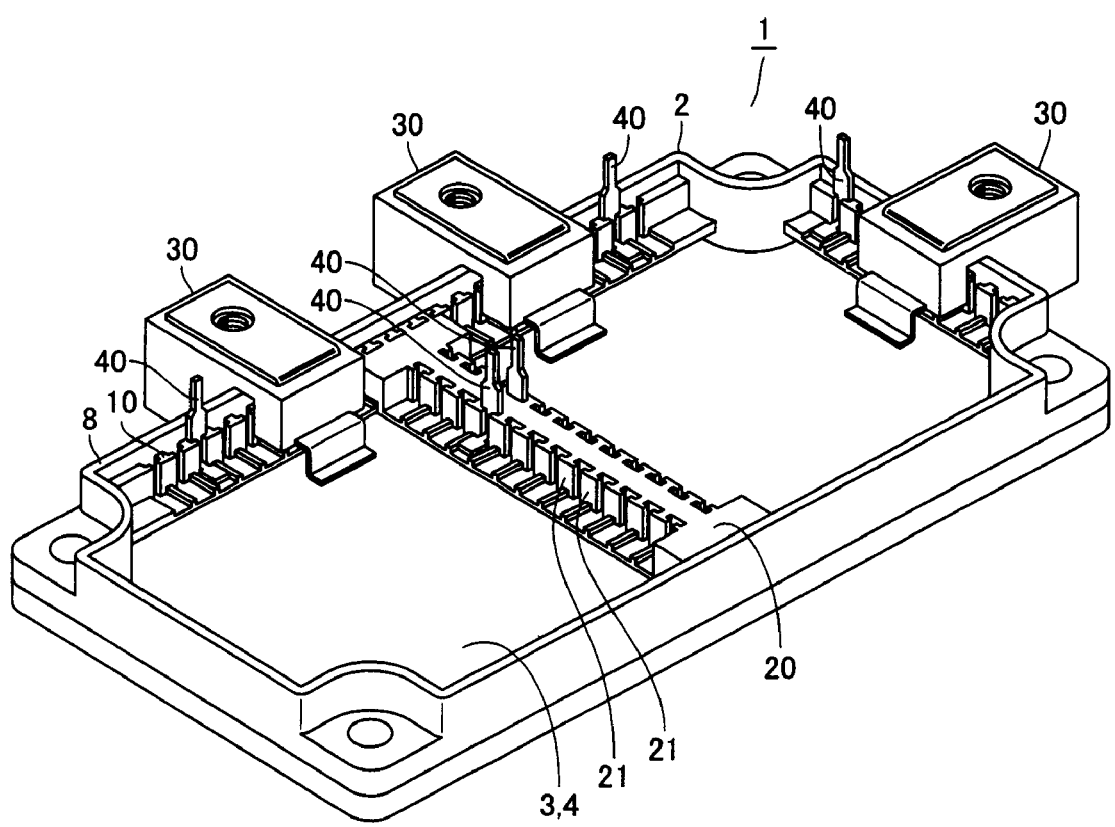
FIG. 31 is a perspective view showing a state in which attachment of the screw block terminal, the pin terminal and the terminal attachment member to the case member is completed, in accordance with the embodiment.

In this manner, terminal attachment member 20 is attached to a prescribed position of case member 2, and screw block terminal 30 or pin terminal 40 is fixed on the attached terminal attachment member 20, whereby screw block terminal 30 or pin terminal 40 can be attached to a region inside the base plate 3, as shown in FIG. 31.

In semiconductor device 1 described above, terminal attachment member 20 has side fitting portions 22 corresponding to wall-like bodies 10 respectively formed on the one and the other ends along the direction of extension of terminal attachment member 20. Therefore, terminal attachment member 20 can more firmly be fixed on case member 2, even when a structure that fits to base plate 3 or semiconductor mounting board 4 cannot be provided.

Further, a plurality of wall-like bodies 21 are formed, spaced by a prescribed interval from each other, along the direction of extension, on each of one and the other side portions 20a and 20b extending opposite to each other. Consequently, it becomes possible to further increase the degree of freedom in arranging screw block terminal 30 and pin terminal 40, in accordance with the position of semiconductor mounting board 4.

Embodiment 7

Figure 32:
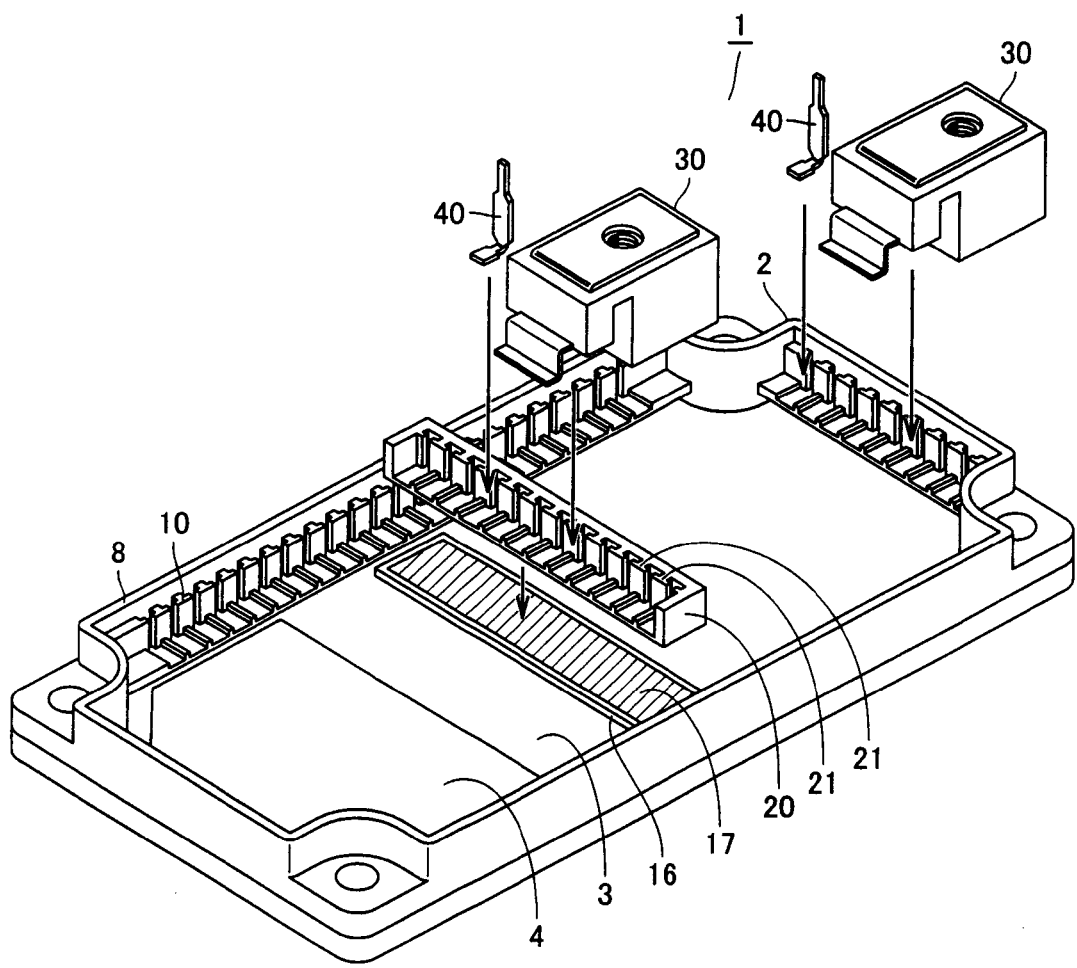
FIG. 32 is an exploded perspective view showing the manner of attaching the screw block terminal, the pin terminal and the terminal attachment member to the case member in accordance with Embodiment 7 of the present invention.

In Embodiment 7, a semiconductor device having a terminal attachment member attached to the case member independent from the wall-like bodies formed along the sidewall portion will be described. Referring to FIG. 32, terminal attachment member 20 has wall-like bodies 21, similar to wall-like bodies 10 formed along sidewall portion 8, formed along the direction of extension of terminal attachment member 20. On base plate 3 of case member 2, an insulating substrate 16 for fixing terminal attachment member 20 is attached on a prescribed position.

On upper and lower surfaces of insulating substrate 16, copper patterns 15 and 17 are formed. Insulating substrate 16 is bonded by solder 18 interposed between base plate 3 and copper pattern 15 on the lower surface. Further, terminal attachment member 20 is bonded by solder 18 to copper pattern 17 on the upper surface of insulating substrate 16 (see FIG. 34). Except for these points, the structure is the same as that of the semiconductor device described above, and therefore, corresponding portions are denoted by the same reference characters and description thereof will not be repeated.

Next, the manner of attaching terminal attachment member 20 and the like in semiconductor device 1 will be described. Referring to FIG. 32, first, insulating substrate 16 for attaching terminal attachment member 20 is bonded by solder 18 interposed between copper pattern 15 on the lower surface and base plate 3. Then, to copper pattern 17 on the upper surface of insulating substrate 16, terminal attachment member 20 is bonded by solder 18 (see FIG. 34).

Next, screw block terminal 30 or pin terminal 40 attached to sidewall portion 8 is fixed in the similar manner as described above. Next, to the prescribed position of the terminal attachment member 20 attached to case member 2, screw block terminal 30 is aligned, and projection 35 of screw block terminal 30 is fit to the space between wall-like bodies 21, 21 (see FIG. 14), whereby screw block terminal 30 is fixed on terminal attachment member 20. Further, by aligning pin terminal 40 at a prescribed position and by inserting pin terminal 40 between two adjacent wall-like bodies 21, 21 at the prescribed position, pin terminal 40 is fixed on terminal attachment member 20.

Figure 33:
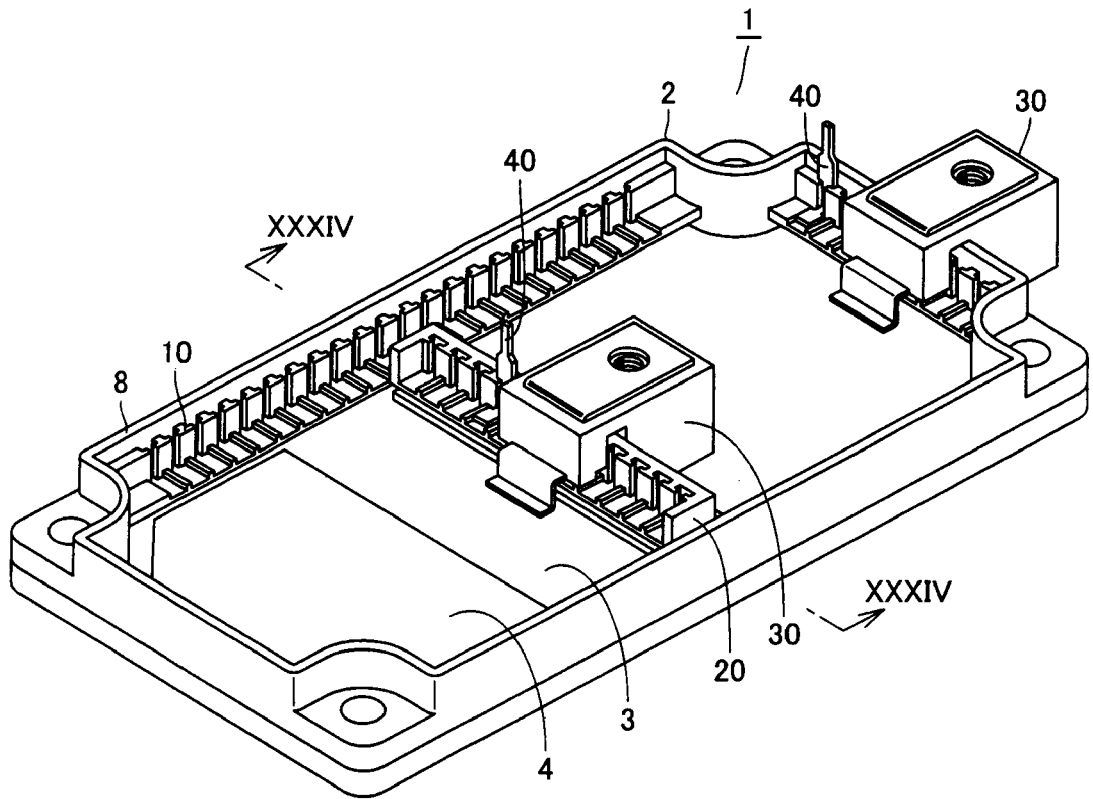
FIG. 33 is a perspective view showing a state in which attachment of the screw block terminal, the pin terminal and the terminal attachment member to the case member is completed, in accordance with the embodiment.
Figure 34:
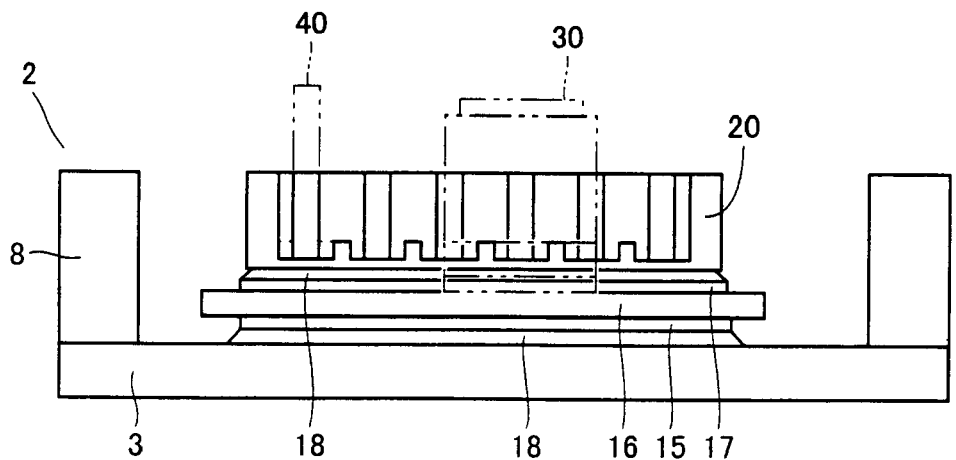
FIG. 34 is a cross-sectional view taken along the section line XXXIV-XXXIV of FIG. 33 of the embodiment.

In this manner, terminal attachment member 20 is attached to a prescribed position of case member 2, and screw block terminal 30 or pin terminal 40 is fixed on the attached terminal attachment member 20, whereby screw block terminal 30 or pin terminal 40 can be attached to a region inside the base plate 3, as shown in FIGS. 33 and 34.

In semiconductor device 1 described above, more accurate positioning of terminal attachment member 20 to be attached to semiconductor mounting board 4 becomes possible, regardless of the position of wall-like bodies 10 formed along sidewall portion 8, and therefore, it becomes possible to further increase the degree of freedom as to the attachment position of screw block terminal 30 and pin terminal 40.

Embodiment 8

Figure 35:
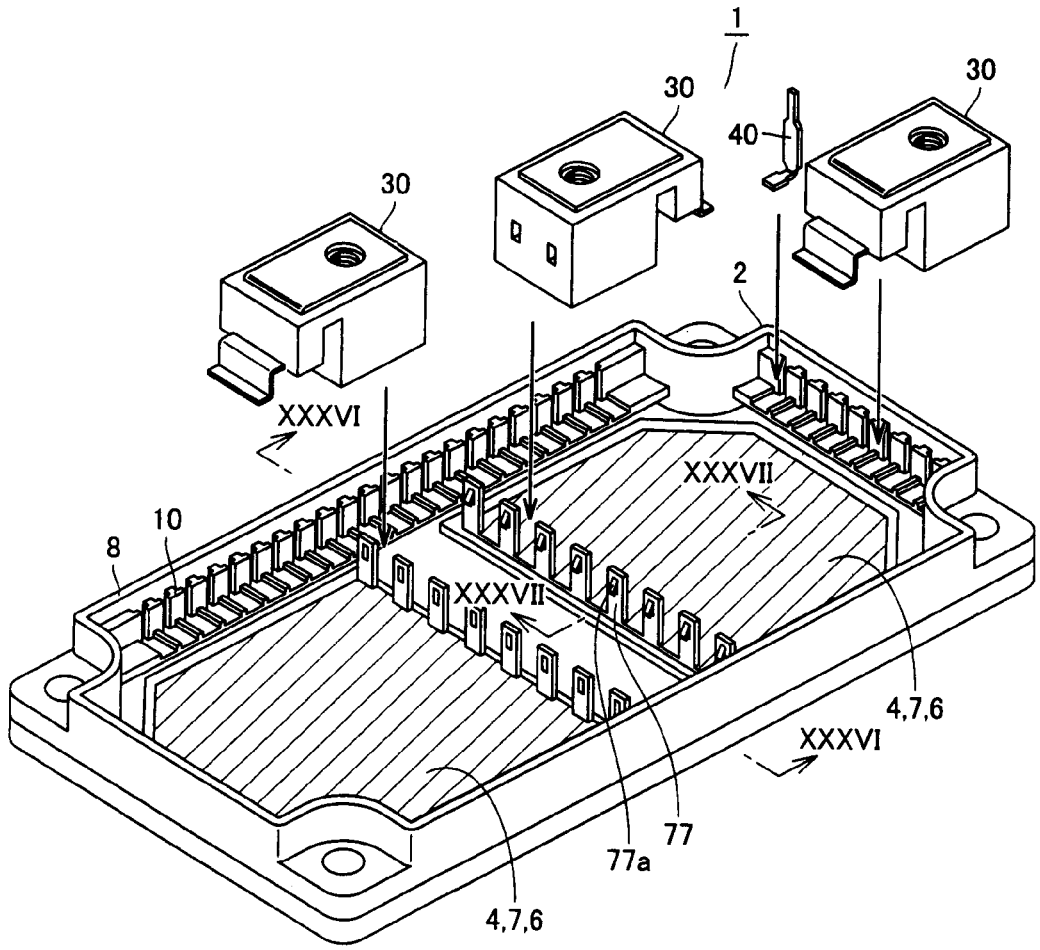
FIG. 35 is an exploded perspective view showing the manner of attaching the screw block terminal, the pin terminal and the terminal attachment member to the case member in accordance with Embodiment 8 of the present invention.

In Embodiment 8, a semiconductor device in which the screw block terminal is fixed utilizing a copper pattern formed on a surface of an insulating substrate of the semiconductor mounting board will be described. Referring to FIG. 35, on an outer peripheral portion of a copper pattern formed on a surface of insulating substrate 6 of semiconductor mounting board 4, a plurality of catching portions 77 are formed protruded and spaced by a prescribed interval from each other, for fixing screw block terminal 30. Catching portion 77 is formed, for example, by bending an outer peripheral portion of copper pattern 7, patterned to a prescribed shape. At a tip end portion of catching portion 77, a hook 77a is formed, for catching screw block terminal 30.

Figure 36:
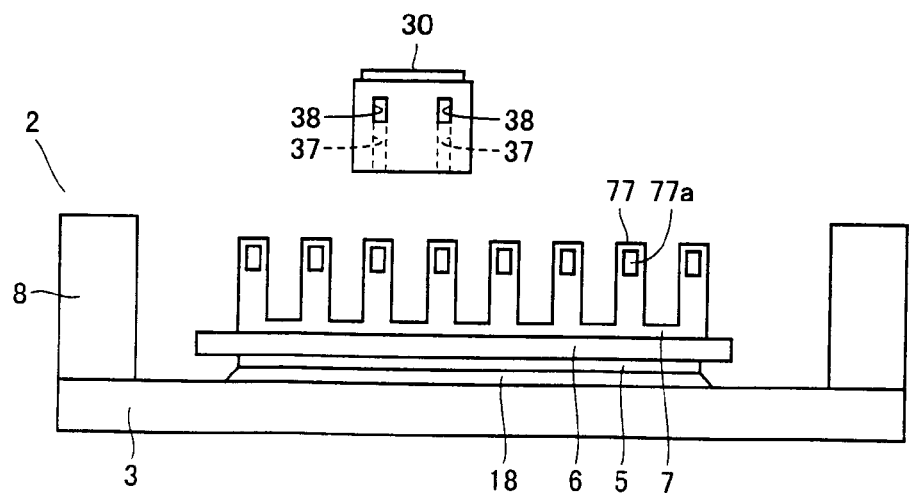
FIG. 36 is a cross-sectional view taken along the section line XXXVI-XXXVI of FIG. 35 of the embodiment.
Figure 37:
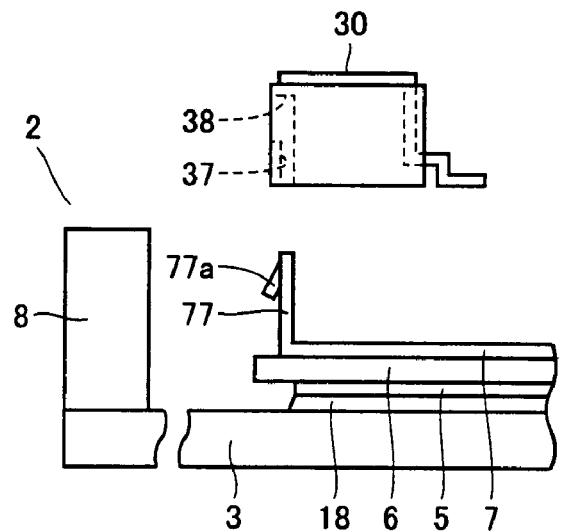
FIG. 37 is a cross-sectional view taken along the section line XXXVII-XXXVII of FIG. 35 of the embodiment.

As shown in FIGS. 36 and 37, passages 37 are formed in screw block terminal 30, to which two adjacent catching portions 77 are inserted. Further, on a side of screw block terminal 30, an opening 38 communicated with passage 37 for exposing hook 77a is formed.

Next, the manner of attaching screw block terminal 30 or pin terminal 40 in semiconductor device 1 will be described. Screw block terminal 30 or pin terminal 40 attached to sidewall portion 8 is fixed in the similar manner as described above.

Figure 38:
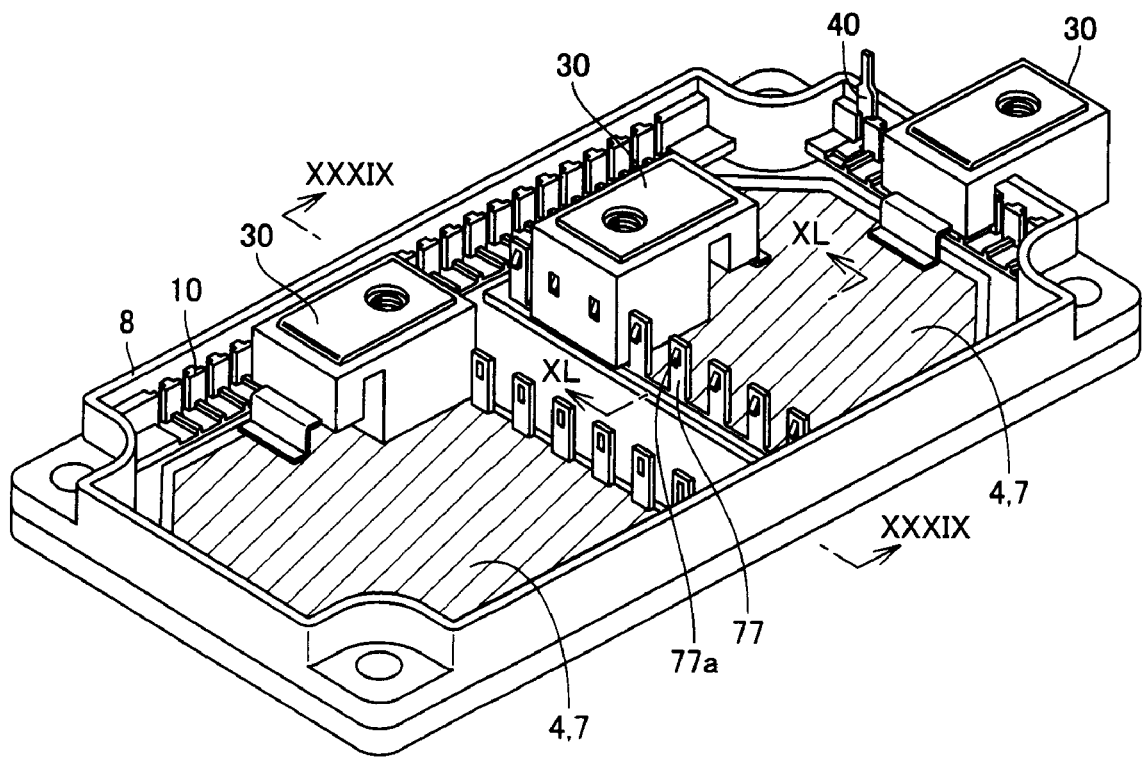
FIG. 38 is a perspective view showing a state in which attachment of the screw block terminal, the pin terminal and the terminal attachment member to the case member is completed, in accordance with the embodiment.
Figure 39:
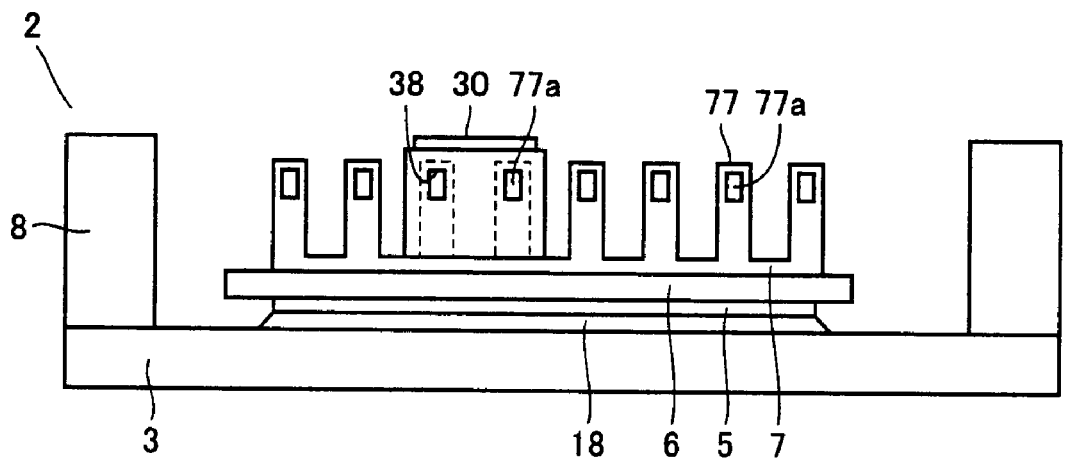
FIG. 39 is a cross-sectional view taken along the section line XXXIX-XXXIX of FIG. 38 of the embodiment.
Figure 40:
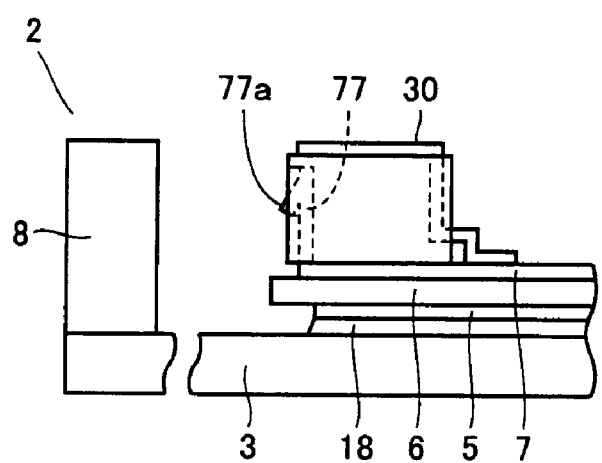
FIG. 40 is a cross-sectional view taken along the section line XL-XL of FIG. 38 of the embodiment.

Next, as shown in FIGS. 35, 36 and 37, screw block terminal 30 is aligned to a prescribed position relative to catching portions 77 of copper pattern, and catching portion 77 positioned at that position is inserted to passage 37 of screw block terminal 30 to have the hook 77a exposed through opening 38. With hook 77a exposed through opening 38, screw block terminal 30 is caught by catching portion 77, and screw block terminal 30 is fixed on semiconductor mounting board 4. In this manner, utilizing copper pattern 7 formed on the surface of insulating plate 6 of semiconductor mounting board 4, screw block terminal 30 can be provided in a region inside base plate 3, as shown in FIGS. 38, 39 and 40.

In semiconductor 1 described above, it is possible to attach screw block terminal 30 utilizing copper pattern 7 formed on the surface of insulating plate 6 of semiconductor mounting board 4. Therefore, the number of components can be reduced, and the process time can also be reduced, as simpler assembly of the semiconductor device becomes possible.

In each of the embodiments above, examples in which projection 35 is formed on overhang portion 34 and the projection 35 is fitted in the space between wall-like bodies 10, 21 to fix screw block terminal 30 on case member 2 have been described. The structure is not limiting, and any structure may be used provided that overhang portion 34 can be fixed on the wall-like bodies 10, 21.

The semiconductor device of the present invention may be effectively used as a semiconductor device for driving an inverter of industrial equipment.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
 a case member having a base plate and a sidewall portion formed along an outer edge of said base plate, housing a semiconductor mounting board;
 a plurality of terminals each electrically connected to said semiconductor mounting board;
 first terminal fixing portions formed inside and along said sidewall portion with a prescribed interval, for fixing any of said plurality of terminals by fitting the terminal thereto; and
 a terminal attachment member having, at least on one end side, a one-end-side fitting portion that fits into said first terminal fixing portion, and attached to extend from said outer edge of said base plate to an inner region of the semiconductor device, and having second terminal fixing portions formed at a prescribed interval along a direction of extension, for fixing another one of said plurality of terminals by fitting said another one of the terminals.

2. The semiconductor device according to claim 1, wherein said first terminal fixing portions are formed at a prescribed pitch, on said sidewall portion; and
 said second terminal fixing portions are formed at the same pitch as said prescribed pitch, along the direction of extension of said terminal attachment member.

3. The semiconductor device according to claim 1, wherein said second terminal fixing portions are formed both on one side portion and the other side portion extending opposite to each other.

4. The semiconductor device according to claim 3, wherein of said second terminal fixing portions, positions along the direction of extension of the second terminal fixing portions formed on said one side portion are the same as positions along the direction of extension of the second terminal fixing portions formed on said the other side portion.

5. The semiconductor device according to claim 3, wherein of said second terminal fixing portions, positions along the direction of extension of the second terminal fixing portions formed on said one side portion are different from positions along the direction of extension of the second terminal fixing portions formed on said the other side portion.

6. The semiconductor device according to claim 1, wherein said terminal attachment member is placed on said base plate;
 said terminal attachment member has a bottom fitting portion formed at a bottom portion to be in contact with said base plate to fit to said base plate; and a base side fitting portion to fit said bottom fitting portion is formed on said base plate.

7. The semiconductor device according to claim 1, wherein said semiconductor mounting board includes an insulating substrate placed on said base plate;

said terminal attachment member is placed on said insulating substrate;

said terminal attachment member has a bottom fitting portion formed at a bottom portion to be in contact with said insulating substrate to fit to said insulating substrate; and an insulating substrate side fitting portion to fit said bottom fitting portion is formed on said insulating substrate.

8. The semiconductor device according to claim 1, wherein said terminal attachment member has, on the other end side, the-other-end-side fitting portion to fit said first terminal fixing portion; and said terminal attachment member is attached to said case member with said one-end-side fitting portion fitted to one said first terminal fixing portion and said the-other-end-side fitting portion fitted to the other said first terminal fixing portion, of mutually opposite said first terminal fixing portions.

9. A semiconductor device, comprising:

a case member having a base plate and a sidewall portion formed along an outer edge of said base plate, housing a semiconductor mounting board;

a plurality of terminals each electrically connected to said semiconductor mounting board;

first terminal fixing portions formed inside and along said sidewall portion with a prescribed interval, for fixing any of said plurality of terminals by fitting the terminal thereto; and a terminal attachment member arranged on said base plate and having second terminal fixing portions formed with a prescribed interval, for fixing another one of said plurality of terminals by fitting said another one of the terminals.

* * * * *